United States Patent
Paterson et al.

(10) Patent No.: US 7,264,688 B1
(45) Date of Patent: Sep. 4, 2007

(54) PLASMA REACTOR APPARATUS WITH INDEPENDENT CAPACITIVE AND TOROIDAL PLASMA SOURCES

(75) Inventors: Alexander Paterson, San Jose, CA (US); Valentin N. Todorow, Palo Alto, CA (US); Theodoros Panagopoulos, San Jose, CA (US); Brian K. Hatcher, San Jose, CA (US); Dan Katz, Saratoga, CA (US); Edward P. Hammond, IV, Hillsborough, CA (US); John P. Holland, San Jose, CA (US); Alexander Matyushkin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/411,163

(22) Filed: Apr. 24, 2006

(51) Int. Cl.
 C23F 1/00 (2006.01)
 C23C 16/00 (2006.01)

(52) U.S. Cl. .................. 156/345.34; 156/345.38; 156/345.48; 156/345.51; 156/345.54; 118/723 R; 118/729

(58) Field of Classification Search .......... 156/345.29, 156/345.33, 345.34, 345.37, 345.38, 345.44, 156/345.45, 345.48, 345.51, 345.54; 118/723 R, 118/728, 729; 216/68; 315/111.21
See application file for complete search history.

(56) References Cited

U.S. PATENT DOCUMENTS

| | | | |
|---|---|---|---|
| 4,579,618 A | 4/1986 | Celestino et al. ........... 156/345 |
| 4,585,516 A | 4/1986 | Corn et al. ................. 156/643 |
| 4,863,549 A | 9/1989 | Grunwald ................... 156/345 |
| 5,512,130 A | 4/1996 | Barna et al. ............. 156/651.1 |
| 5,556,501 A | 9/1996 | Collins et al. .............. 156/345 |
| 5,817,534 A | 10/1998 | Ye et al. ....................... 438/10 |
| 5,846,885 A | 12/1998 | Kamata et al. ............. 438/729 |
| 5,985,375 A | 11/1999 | Donohoe et al. ........... 427/492 |
| 6,033,585 A | 3/2000 | Wicker et al. ................ 216/68 |
| 6,089,181 A | 7/2000 | Suemasa et al. ............ 118/723 |

(Continued)

FOREIGN PATENT DOCUMENTS

EP 553704 A1 8/1993

(Continued)

OTHER PUBLICATIONS

Kim, H.C., et al., "Analytic model for a dual frequency capacitive discharge", Physics of Plasmas, Nov. 2003, pp. 4545-4551, vol. 10, No. 11, American Institute of Physics, USA.

*Primary Examiner*—Thuy Vinh Tran
(74) *Attorney, Agent, or Firm*—Robert M. Wallace

(57) ABSTRACT

A plasma reactor includes a toroidal plasma source having an RF power applicator, and RF generator being coupled to the RF power applicator. The reactor further includes a capacitively coupled plasma source power applicator or electrode at the ceiling or the workpiece support, a VHF power generator being coupled to the capacitively coupled source power applicator, a plasma bias power applicator or electrode in the workpiece support and an RF bias power generator coupled to the plasma bias power applicator. A controller adjusts the relative amounts of power simultaneously coupled to plasma in the chamber and conduit by the toroidal plasma source and by the capacitively coupled plasma source power applicator.

16 Claims, 19 Drawing Sheets

U.S. PATENT DOCUMENTS

| | | | |
|---|---|---|---|
| 6,110,287 A | 8/2000 | Arai et al. | 118/723 |
| 6,113,731 A | 9/2000 | Shan et al. | 156/345 |
| 6,126,778 A | 10/2000 | Donohoe et al. | 156/345 |
| 6,190,496 B1 | 2/2001 | DeOrnellas et al. | 156/345 |
| 6,193,855 B1 | 2/2001 | Gopalraja et al. | 204/192.12 |
| 6,270,617 B1 | 8/2001 | Yin et al. | 156/345 |
| 6,309,978 B1 | 10/2001 | Donohoe et al. | 438/710 |
| 6,312,556 B1 | 11/2001 | Donohoe et al. | 156/345 |
| 6,354,240 B1 | 3/2002 | DeOrnellas et al. | 118/723 |
| 6,403,491 B1 | 6/2002 | Liu et al. | 438/710 |
| 6,444,084 B1 | 9/2002 | Collins | 156/345 |
| 6,444,085 B1 | 9/2002 | Collins et al. | 156/345 |
| 6,454,898 B1 | 9/2002 | Collins et al. | 156/345 |
| 6,468,388 B1 * | 10/2002 | Hanawa et al. | 156/345.48 |
| 6,642,149 B2 | 11/2003 | Suemasa et al. | 438/710 |
| 6,656,273 B1 | 12/2003 | Toshima et al. | 118/56 |
| 6,939,434 B2 * | 9/2005 | Collins et al. | 156/345.35 |
| 7,094,316 B1 * | 8/2006 | Hanawa et al. | 156/345.48 |
| 7,094,670 B2 * | 8/2006 | Collins et al. | 438/513 |
| 2002/0039626 A1 | 4/2002 | Nakahigashi et al. | 427/569 |
| 2002/0041160 A1 | 4/2002 | Barnes et al. | 315/111.21 |
| 2004/0154747 A1 | 8/2004 | Ni et al. | 156/345.48 |
| 2005/0230047 A1 * | 10/2005 | Collins et al. | 156/345.33 |
| 2006/0081558 A1 * | 4/2006 | Collins et al. | 216/67 |

FOREIGN PATENT DOCUMENTS

| | | |
|---|---|---|
| JP | 2003-073836 | 3/2003 |
| WO | WO 03043061 | 5/2003 |

* cited by examiner

PLASMA REACTOR APPARATUS WITH INDEPENDENT CAPACITIVE AND TOROIDAL PLASMA SOURCES

BACKGROUND OF THE INVENTION

In semiconductor fabrication processes, conventional sources of plasma source power, such as inductively coupled RF power applicators or capacitively couple RF power applicators, introduce inherent plasma density non-uniformities into the processing. In particular, inductively coupled plasma sources are characterized by an "M"-shaped radial distribution of plasma ion density over the semiconductor workpiece or wafer. As device geometries have continued to shrink, such non-uniformities become more critical, requiring better compensation. Presently, the non-uniformity of an overhead inductively coupled source is reduced or eliminated at the wafer surface by optimizing the coil design and ceiling-to-wafer distance, aspect ratio, of the chamber. This distance must be sufficient so that diffusion effects can overcome the effects of the nonuniform ion distribution in the ion generation region before they reach the wafer. For smaller device geometries on the wafer and the inductive plasma source located near the ceiling, a large ceiling-to-wafer distance is advantageous. However, a large ceiling-to-wafer distance can prevent the beneficial gas distribution effects of a ceiling gas distribution showerhead from reaching the wafer surface, due to diffusion over the large distance. For such large ceiling-to-wafer distances, it has been found that the gas distribution uniformity is not different whether a gas distribution showerhead is employed or a small number of discrete injection nozzles are employed.

In summary, the wafer-ceiling gap is optimized for ion density uniformity which may not necessarily lead to gas delivery optimization.

One limitation of such reactors is that not all process parameters can be independently controlled. For example, in an inductively coupled reactor, in order to increase reaction (etch) rate, the plasma source power must be increased to increase ion density. But, this increases the dissociation in the plasma, which can reduce etch selectivity and increase etch microloading problems, in some cases. Thus, the etch rate must be limited to those cases where etch selectivity or microloading are critical.

Another problem arises in the processing (e.g., etching) of multi-layer structures having different layers of different materials. Each of these layers is best processed (e.g., etched) under different plasma conditions. For example, some of the sub-layers may be best etched in an inductively coupled plasma with high ion density and high dissociation (for low mass highly reactive species in the plasma). Other layers may be best etched in a capacitively coupled plasma (low dissociation, high mass ions and radicals), while yet others may be best etched in plasma conditions which may be between the two extremes of purely inductively or capacitively coupled sources. However, to idealize the processing conditions for each sub-layer of the structure being etched would require different process reactors, and this is not practical.

SUMMARY OF THE INVENTION

A plasma reactor for processing a workpiece, includes an enclosure forming a reactor chamber and a workpiece support within the chamber, the enclosure including a ceiling facing the workpiece support, a toroidal plasma source comprising a hollow reentrant conduit external of the chamber and having a pair of ends connected to the interior of the chamber and forming a closed toroidal path extending through the conduit and across the diameter of the workpiece support, and an RF power applicator adjacent a portion of the reentrant external conduit, and an RF power generator coupled to the RF power applicator of the toroidal plasma source. The reactor further includes a capacitively coupled plasma source power applicator comprising a source power electrode at one of: (a) the ceiling (b) the workpiece support, and a VHF power generator coupled to the capacitively coupled source power applicator, a plasma bias power applicator comprising a bias power electrode in the workpiece support and at least a first RF bias power generator coupled to the plasma bias power applicator. Process gas distribution apparatus is provided as a gas distribution showerhead in the ceiling, with a vacuum pump for evacuating the chamber. A first controller adjusts the relative amounts of power simultaneously coupled to plasma in the chamber and conduit by the toroidal plasma source and the capacitively coupled plasma source power applicator.

DETAILED DESCRIPTION OF THE INVENTION

Figure 1:
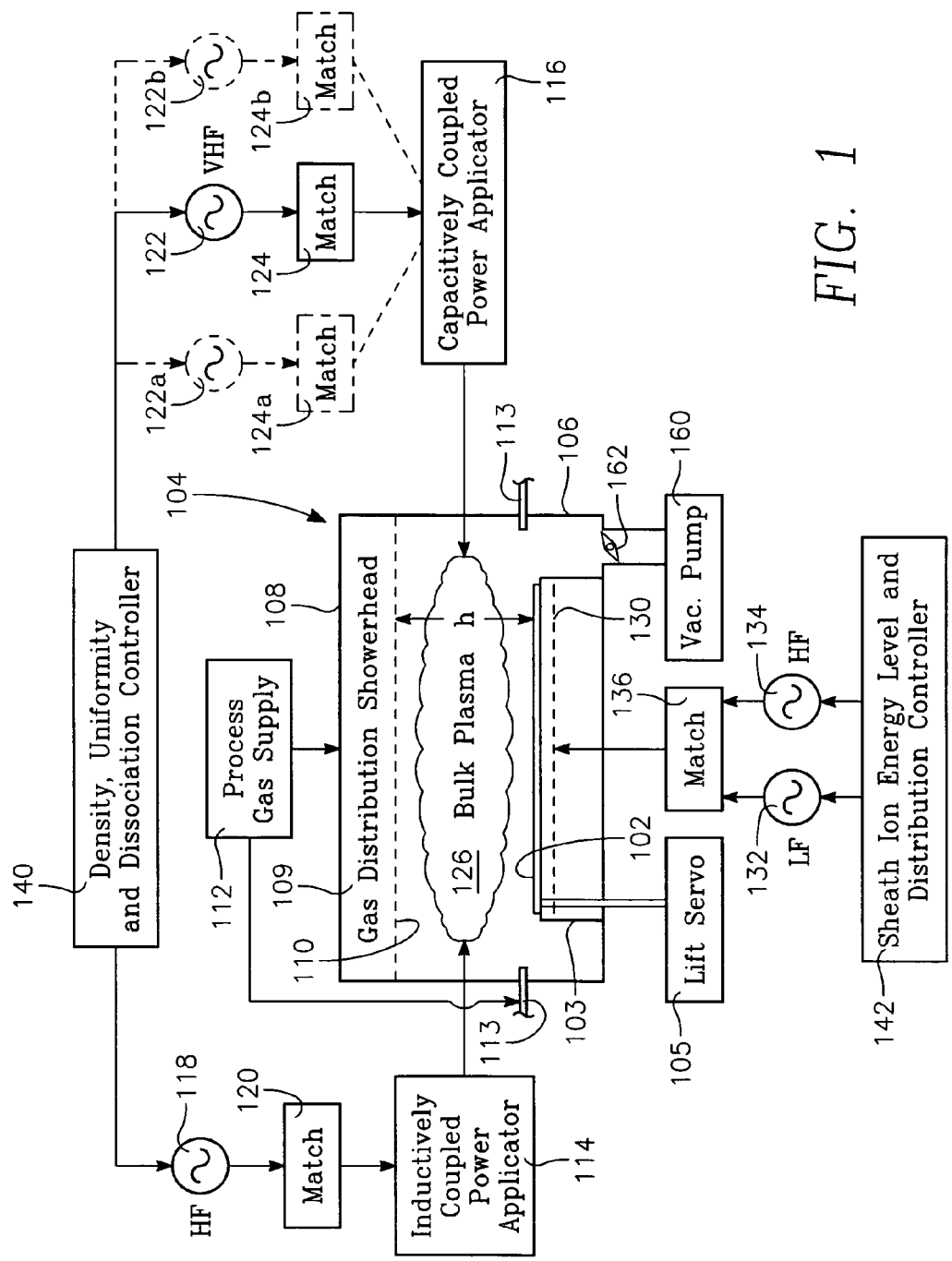
FIG. 1 is a simplified block diagram of a plasma reactor in accordance with an embodiment of the invention.

FIG. 1 depicts a plasma reactor for processing a workpiece 102, which may be a semiconductor wafer, held on a workpiece support 103, which may (optionally) be raised and lowered by a lift servo 105. The reactor consists of a chamber 104 bounded by a chamber sidewall 106 and a ceiling 108. The ceiling 108 may comprise a gas distribution showerhead 109 having small gas injection orifices 110 in its interior surface, the showerhead 109 receiving process gas from a process gas supply 112. In addition, process gas may be introduced through gas injection nozzles 113. The reactor includes both an inductively coupled RF plasma source power applicator 114 and a capacitively coupled RF plasma source power applicator 116. The inductively coupled RF plasma source power applicator 114 may be an inductive antenna or coil overlying the ceiling 108. In order to permit inductive coupling into the chamber 104, the gas distribution showerhead 109 may be formed of a dielectric material such as a ceramic. The VHF capacitively coupled source power applicator 116 is an electrode which may be located within the ceiling 108 or within the workpiece support 103. In an alternative embodiment, the capacitively coupled source power applicator 116 may consist of an electrode within the ceiling 108 and an electrode within the workpiece support 103, so that RF source power may be capacitively coupled from both the ceiling 108 and the workpiece support 103. (If the electrode is within the ceiling 108, then it may have multiple slots to permit inductive coupling into the chamber 104 from an overhead coil antenna.) An RF power generator 118 provides high frequency (HF) power (e.g., within a range of about 10 MHz through 27 MHz) through an optional impedance match element 120 to the inductively coupled source power applicator 114. Another RF power generator 122 provides very high frequency (VHF) power (e.g., within a range of about 27 MHz through 200 MHz) through an optional impedance match element 124 to the capacitively coupled power applicator 116. The efficiency of the capacitively coupled power source applicator 116 in generating plasma ions increases as the VHF frequency increases, and the frequency range preferably lies in the VHF region for appreciable capacitive coupling to occur. As indicated symbolically in FIG. 1, power from both RF power applicators 114, 116 is coupled to a bulk plasma 126 within the chamber 104 formed over the workpiece support 103. RF plasma bias power is capacitively coupled to the workpiece 102 from an RF bias power supply coupled to (for example) an electrode 130 inside the workpiece support and underlying the wafer 102. The RF bias power supply may include a low frequency (LF) RF power generator 132 and another RF power generator 134 that may be either a medium frequency (MF) or a high frequency (HF) RF power generator. An impedance match element 136 is coupled between the bias power generators 132, 134 and the workpiece support electrode 130. A vacuum pump 160 evacuates process gas from the chamber 104 through a valve 162 which can be used to regulate the evacuation rate. The evacuation rate through the valve 162 and the incoming gas flow rate through the gas distribution showerhead 109 determine the chamber pressure and the process gas residency time in the chamber.

The plasma ion density increases as the power applied by either the inductively coupled power applicator 114 or VHF capacitively coupled power applicator 116 is increased. However, they behave differently in that the inductively coupled power promotes more dissociation of ions and radicals in the bulk plasma and a center-low radial ion density distribution. In contrast, the VHF capacitively coupled power promotes less dissociation and a center high radial ion distribution, and furthermore provides greater ion density as its VHF frequency is increased.

The inductively and capacitively coupled power applicators may be used in combination or separately, depending upon process requirements. Generally, when used in combination, the inductively coupled RF power applicator 114 and the capacitively coupled VHF power applicator 116 couple power to the plasma simultaneously, while the LF and HF bias power generators simultaneously provide bias power to the wafer support electrode 130. As will be discussed below, the simultaneous operation of these sources enables independent adjustment of the most important plasma processing parameters, such as plasma ion density, plasma ion radial distribution (uniformity), dissociation or chemical species content of the plasma, sheath ion energy and ion energy distribution (width). For this purpose, a source power controller 140 regulates the source power generators 118, 122 independently of one another (e.g., to control their ratio of powers) in order to control bulk plasma ion density, radial distribution of plasma ion density and dissociation of radicals and ions in the plasma, as will be described in a later portion of this specification. The controller 140 is capable of independently controlling the output power level of each RF generator 118, 122. In addition, or alternatively, the controller 140 is capable of pulsing the RF output of either one or both of the RF generators 118, 122 and of independently controlling the duty cycle of each, or of controlling the frequency of the VHF generator 122 and, optionally, of the HF generator 118. In addition, a bias power controller 142 controls the output power level of each of the bias power generators 132, 134 independently in order to control both the ion energy level and the width of the ion energy distribution, as will be described below. The controllers 140, 142 are operated to carry out various methods of the invention.

Figure 2A:
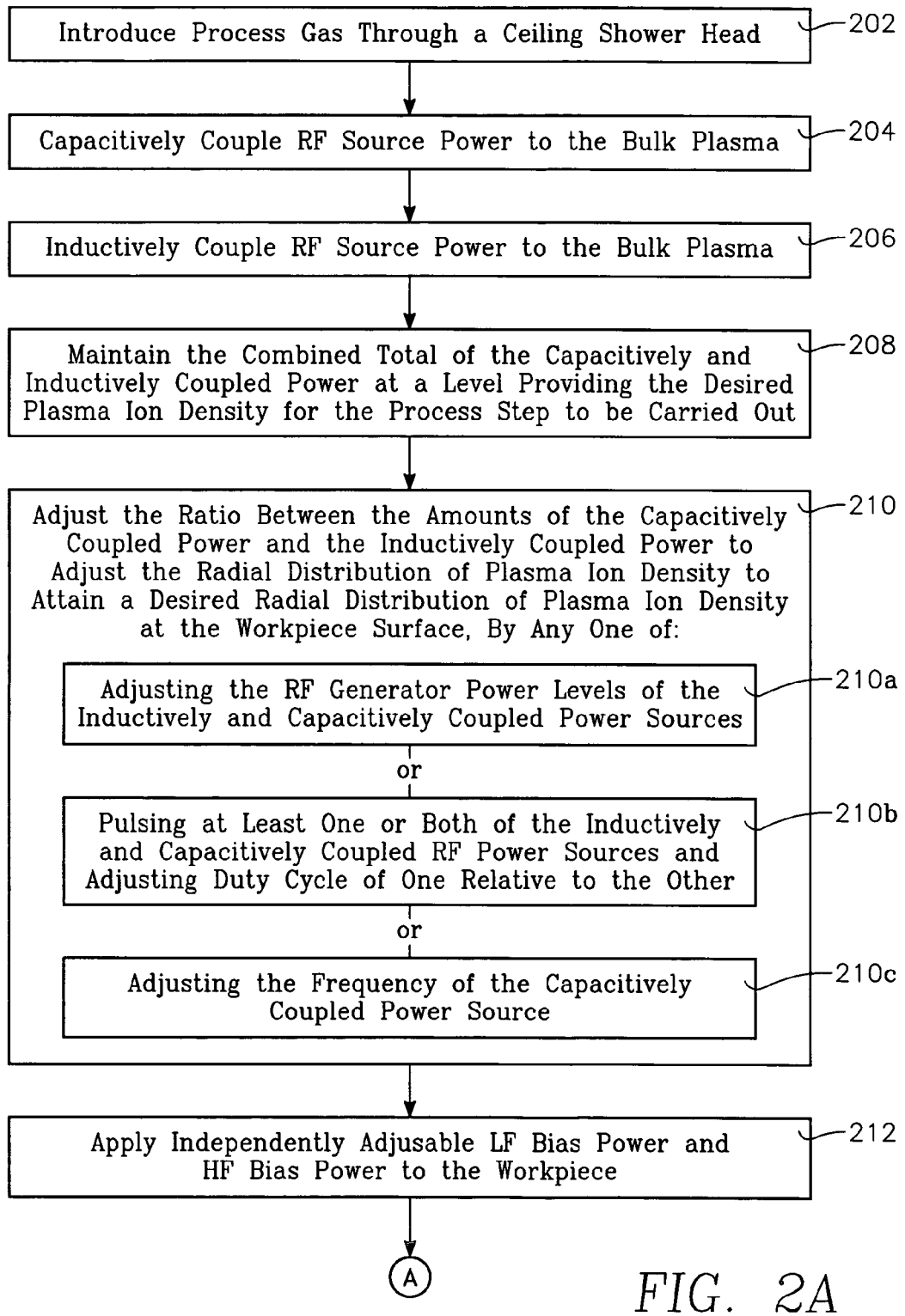
FIGS. 2A and 2B together constitute a block diagram depicting a method of one embodiment of the invention, and these drawings are hereinafter referred to collectively as "FIG. 2".
Figure 2B:
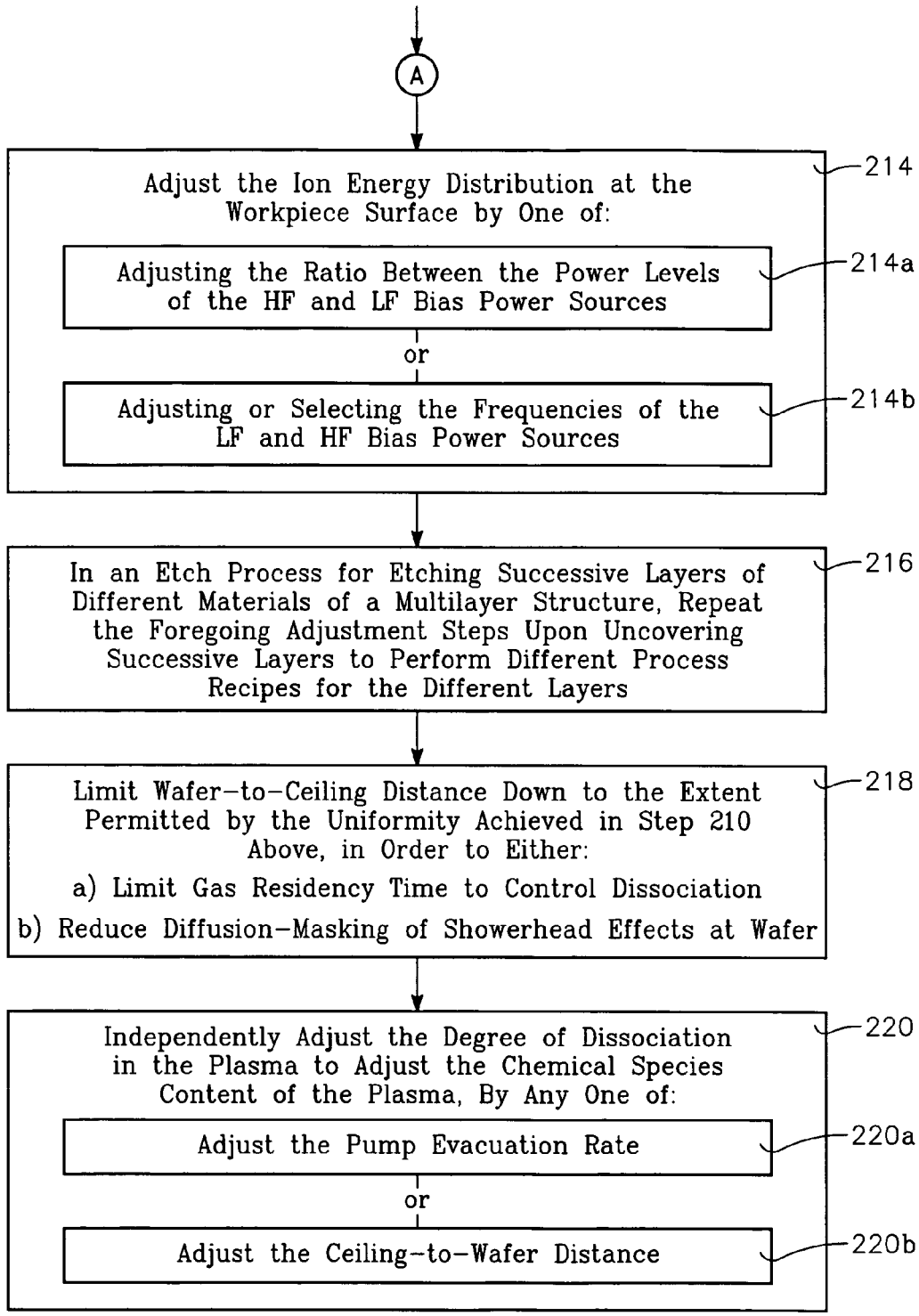

In accordance with a first method of the invention depicted in FIG. 2, plasma ion density, plasma ion density uniformity, sheath ion energy and ion energy distribution (width) are controlled independently of one another. The method of FIG. 2 includes introducing process gas, preferably through the ceiling gas distribution showerhead 109 (block 202 of FIG. 2). The method continues by capacitively coupling VHF source power to the bulk plasma (block 204) while inductively coupling RF source power to the bulk plasma (block 206). The user establishes a certain plasma ion density in accordance with a particular process step. This is accomplished by maintaining the combined total of the VHF capacitively coupled source power and the inductively coupled source power at a level providing the desired plasma ion density for the process step to be carried out (block 208). At the same time, the radial distribution of plasma ion density at the wafer surface is customized (e.g., to make as uniform as possible) while maintaining the desired plasma ion density. This is accomplished by adjusting the ratio between the amounts of the VHF capacitively coupled power and the inductively coupled power (block 210). This apportions the radial ion distribution between the center-low distribution promoted by the inductively coupled power and the center-high distribution promoted by the VHF capacitively coupled power. As will be described below in this specification, this can be accomplished without perturbing the ion density by maintaining the total RF power nearly constant while changing only the ratio between the power delivered by the HF and VHF generators 118, 122.

The adjustment of step 210 can be carried out by any one (or a combination) of the following steps: A first type of adjustment consists of adjusting the RF generator power levels of the inductively and capacitively coupled power sources 118, 122 (block 210a of FIG. 2). Another type consists of pulsing at least one or both of the inductively and capacitively coupled RF power generators 118, 122 and adjusting the duty cycle of one relative to the other (block 210b of FIG. 2). A third type consists of adjusting the effective frequency of the capacitively coupled power VHF generator 122 (block 210c of FIG. 2), in which plasma ion density increases as the VHF frequency is increased. Adjusting the effective VHF frequency of the capacitively coupled plasma source power may be accomplished in a preferred embodiment by providing two VHF generators 122a, 122b of fixed but different VHF frequencies (i.e., an upper VHF frequency $f_1$ output by the generator 122a and a lower VHF frequency $f_2$ output by the generator 122b) whose combined outputs are applied (through impedance matches 124a, 124b) to the capacitive power applicator. Changing the effective VHF frequency $f_{eff}$ within a range bounded by the upper and lower frequencies $f_1$, $f_2$, is performed by varying the ratio between the output power levels $a_1$, $a_2$, of the two generators 122a, 122b. The effective frequency $f_{eff}$ may be approximated to first order as a function of the frequencies $f_1$ and $f_2$ of the two VHF generators 122a, 122b, respectively, and their respective adjustable output power levels, $a_1$ and $a_2$, as follows: $f_{eff}=(a_1f_1+f_2a_2)/(a_1+a_2)$. While the foregoing example involves two VHF generators, a larger number may be employed if desired.

The VHF capacitive source can efficiently create plasma density without creating high RF voltages in the plasma, which is similar to an inductively coupled plasma (ICP) source. In contrast, the LF and HF bias sources efficiently create high RF voltages in the plasma but contribute little to plasma density. Therefore, the combination of the VHF source (or VHF sources) and the ICP source allows the plasma to be produced without the side effect of creating large RF voltages within the plasma. As a result, the RF voltage produced by the LF of HF source applied to wafer pedestal can operate independently from the plasma density creating source. The VHF source can be operated independently from the ICP source, with an ability to create plasma density in combination with the ICP (whereas the traditional ICP source employs an HF or LF capacitively coupled power source connected to the wafer pedestal to create RF voltage on the wafer only).

The method further includes coupling independently adjustable LF bias power and HF bias power supplies to the workpiece (block 212). The controller 142 adjusts the ion energy level and ion energy distribution (width or spectrum) at the workpiece surface by simultaneous adjustments of the two RF bias power generators 132, 134 (block 214). This step is carried out by any one of the following: One way is to adjust the ratio between the power levels of the HF and LF bias power sources 132, 134 (block 214a of FIG. 2). Another (less practical) way is adjusting or selecting the frequencies of the LF and HF bias power sources (block 214b of FIG. 2). In a first embodiment, the LF and HF frequencies are applied to the ESC electrode 130 while the VHF source power is applied to the gas distribution showerhead 110 (in which case the showerhead 110 is the CCP applicator 116) while the ICP applicator 114v overlies the showerhead 110. In a second embodiment, the VHF source power is applied to the ESC electrode 130 along with the HF and LF bias frequencies, while the ICP power applicator 114 overlies the showerhead 110.

If the method is used in an etch process for etching successive layers of different materials of a multilayer structure, the plasma processes for etching each of the layers may be customized to be completely different processes. One layer may be etched using highly dissociated ion and radical species while another layer may be etched in a higher density plasma than other layers, for example. Furthermore, if chamber pressure is changed between steps, the effects of such a change upon radial ion density distribution may be compensated in order to maintain a uniform distribution. All this is accomplished by repeating the foregoing adjustment steps upon uncovering successive layers of the multilayer structure (block 216).

The superior uniformity of plasma ion radial distribution achieved in the step of block 210 makes it unnecessary to provide a large chamber volume above the wafer. Therefore, the distance between the wafer and the plasma source may be reduced without compromising uniformity. This may be done when the reactor is constructed, or (preferably) the wafer support 103 may be capable of being lifted or lowered relative to the ceiling 108 to change the ceiling-to-wafer distance. By thus decreasing the chamber volume, the process gas residency time is decreased, providing independent control over dissociation and plasma species content. Also, reducing the ceiling-to-wafer distance permits the gas distribution effects of the gas distribution showerhead 109 to reach the wafer surface before being masked by diffusion, a significant advantage. Thus, another step of the method consists of limiting the ceiling-to-wafer distance to either (a) limit residency time or (b) prevent the showerhead gas distribution pattern from being masked at the wafer surface by diffusion effects (block 218 of FIG. 2). One advantage is that inductive coupling can now be employed without requiring a large ceiling-to-wafer distance to compensate for the center-low ion distribution characteristic of an inductively coupled source. In fact, the ceiling-to-wafer distance can be sufficiently small to enable an overhead gas distribution showerhead to affect or improve process uniformity at the wafer surface.

The chemical species content of the plasma may be adjusted or regulated independently of the foregoing adjustments (e.g., independently of the adjustment of the radial ion density distribution of the step of block 210) by adjusting the degree of dissociation in the plasma, in the step of block 220 of FIG. 2. This step may be carried out by adjusting the rate at which the chamber 104 is evacuated by the vacuum pump 160 (block 220*a* of FIG. 2), for example by controlling the valve 162, in order to change the process gas residency time in the chamber. (Dissociation increases with increasing residency time and increasing chamber volume.) Alternatively (or additionally), the adjustment of dissociation may be carried out by adjusting the ceiling-to-wafer distance so as to alter the process gas residency time in the chamber (block 220*b* of FIG. 2). This may be accomplished by raising or lowering the workpiece support 103 of FIG. 1. The foregoing measures for adjusting dissociation in the plasma do not significantly affect the ratio of inductive and capacitive coupling that was established in the step of block 210 for adjusting ion distribution or uniformity. Thus, the adjustment of the dissociation or chemical species content of step 220 is made substantially independently of the adjustment of plasma ion density distribution of step 210.

In an alternative embodiment, the capacitively coupled source power applicator 116 consists of electrodes in both the ceiling 108 and the workpiece support 103, and VHF power is applied simultaneously through the electrodes in both the ceiling 108 and the workpiece support 103. The advantage of this feature is that the phase of the VHF voltage (or current) at the ceiling may be different from the phase at the workpiece support, and changing this phase difference changes the radial distribution of plasma ion density in the chamber 104. Therefore, an additional step for adjusting the radial distribution of plasma ion density is to adjust the phase difference between the VHF voltage (or current) at the workpiece support 103 and the VHF voltage (or current) at the ceiling 108. This is indicated in block 230 of FIG. 2. This adjustment may or may not require changing the ratio between capacitive and inductive coupling selected in the step of block 210.

Figure 3A:
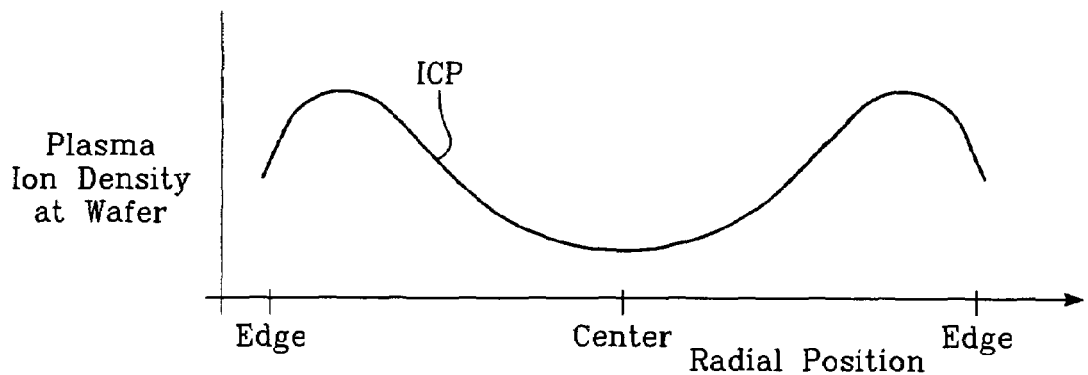
FIG. 3A is a graph depicting a radial distribution of plasma ion density that is typical of an inductively coupled plasma.
Figure 3B:
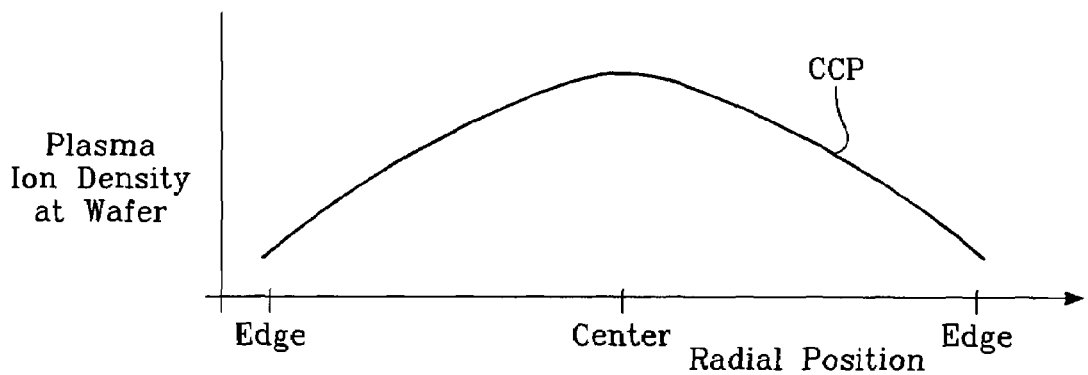
FIG. 3B is a graph depicting the radial distribution of plasma ion density that is typical of a capacitively coupled plasma.
Figure 3C:
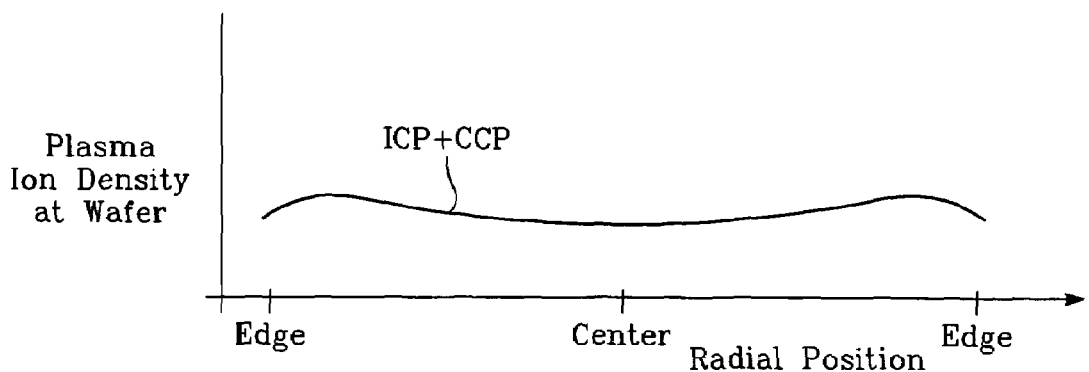
FIG. 3C is a graph depicting the radial distribution of plasma ion density obtained in the reactor of FIG. 1 in accordance with a method of the invention.
Figure 4:
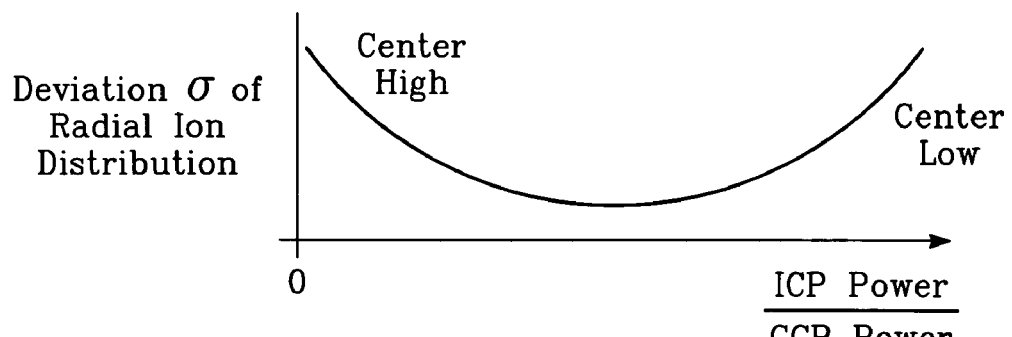
FIG. 4 illustrates ion radial distribution non-uniformity (deviation) as a function of the ratio of the power levels of inductively and capacitively coupled power.
Figure 5:
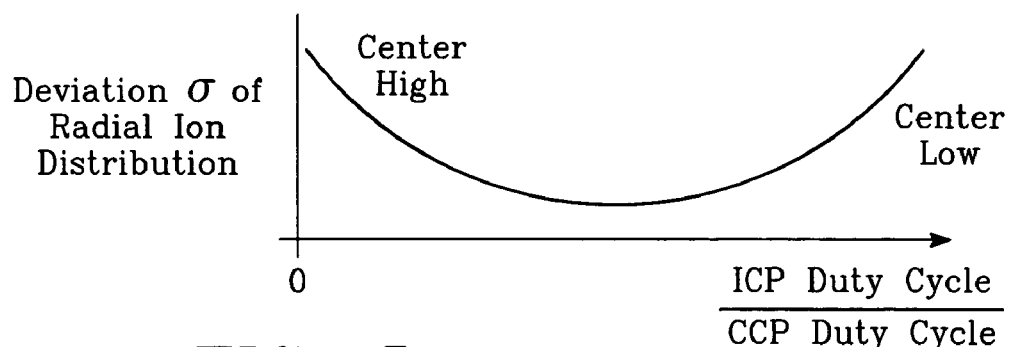
FIG. 5 illustrates ion radial distribution non-uniformity (deviation) as a function of the ratio of the pulse duty cycles of inductively and capacitively coupled power.

FIGS. 3A, 3B and 3C show how the combination of a center-low or "M"-shaped inductively coupled plasma ion density distribution (FIG. 3A) with a center-high capacitively coupled plasma ion density distribution (FIG. 3B) results in a more ideal or more nearly uniform plasma ion density distribution (FIG. 3C) that corresponds to the superposition of the distributions of FIGS. 3A and 3B. The ideal distribution of FIG. 3C is achieved by a careful adjustment of the amount of inductive and capacitive coupling of the two sources 118, 122 of FIG. 1. A high ratio of capacitively coupled power leads to a more center-high distribution, while a high ratio of inductively coupled power leads to a more center-low distribution. Different ratios will result in the ideal distribution at different chamber pressures. One way of apportioning inductive and capacitive coupling is to apportion the amount of RF power of the two generators 118, 122. FIG. 4 depicts how the ratio between the output power levels of the generators 118, 122 affects the radial ion distribution. The minimum or dip in the curve of FIG. 4 corresponds to an ideal power ratio at which the non-uniformity or deviation in ion distribution is the least. Another way of apportioning between inductively and capacitively coupled power is to pulse at least one (or both) of the two generators 118, 122, and control the pulse duty cycle. For example, one of them (the inductive source 118) may be pulsed and the other (the capacitive source 122) may be continuous, and the two are balanced by adjusting the duty cycle of the capacitively couple source 122. Alternatively, both may be pulsed, and apportioning is done by controlling the ratio of the duty cycles of the two sources. The results are depicted in FIG. 5, in which a high ratio of inductively coupled-to-capacitively coupled duty cycles results in more inductively coupled power reaching the plasma and a more center-low distribution, A high ratio of capacitively coupled power-to-inductively coupled power results in more capacitively coupled power in the plasma, providing a center-high distribution.

Figure 6:
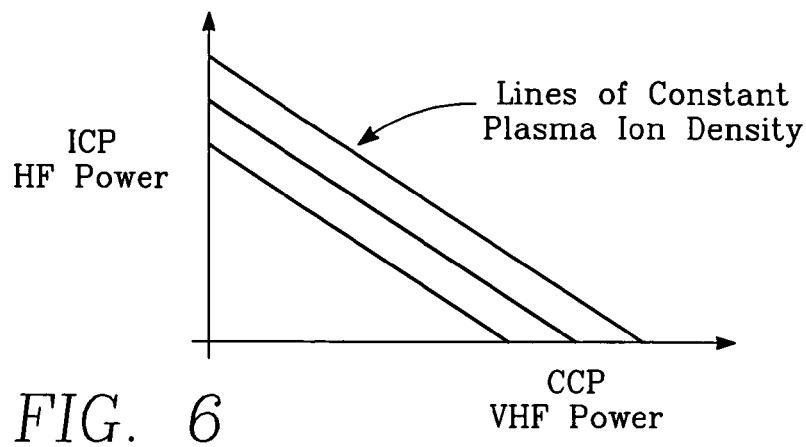
FIG. 6 is a graph illustrating lines of constant plasma ion density for pairs of values of inductively and capacitively coupled power levels.
Figure 7:
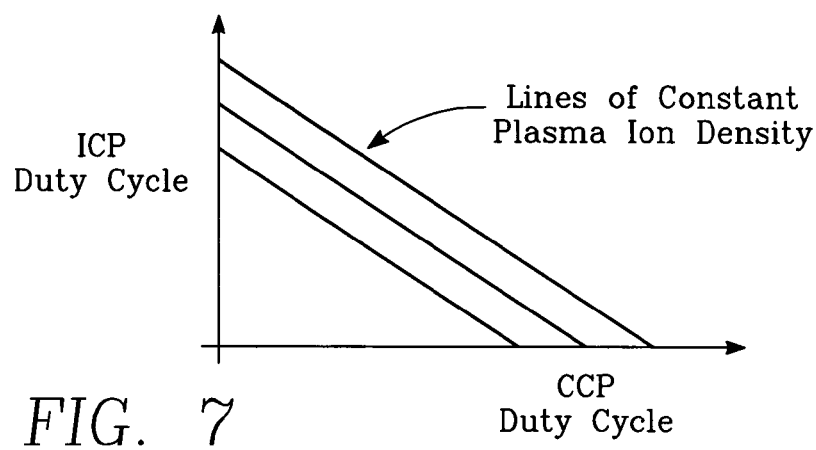
FIG. 7 is a graph illustrating lines of constant plasma ion density for pairs of values of inductively and capacitively coupled power pulsed duty cycles.

The foregoing adjustments to the ion density distribution can be carried out without changing plasma ion density. FIG. 6 illustrates how this is accomplished in the embodiment of FIG. 4 in which uniformity adjustments are made by adjusting RF generator output power. FIG. 6 depicts lines of constant ion density for different combinations of inductively coupled power (vertical axis) and capacitively coupled power (horizontal axis). Provided that the values of inductively and capacitively coupled power from the generators 118, 122 respectively are constrained to lie along a particular one of the lines of constant density, the inductive-capacitive power ratio may be set to any desired value (in order to control uniformity) without changing the plasma ion density. The lines of constant density are deduced for any given reactor by conventional testing. FIG. 7 illustrates how this is accomplished in the embodiment of FIG. 5 in which uniformity adjustments are made by adjusting RF generator pulsed duty cycle. FIG. 7 depicts lines of constant ion density for different combinations of inductively coupled duty cycle (vertical axis) and capacitively coupled duty cycle (horizontal axis). Provided that the values of inductively and capacitively coupled duty cycles from the generators 118, 122 respectively are constrained to lie along a particular one of the lines of constant density, the inductive-capacitive power ratio may be set to any desired value (in order to control uniformity) without changing the plasma ion density. The lines of constant density are deduced for any given reactor by conventional testing.

Figure 8:
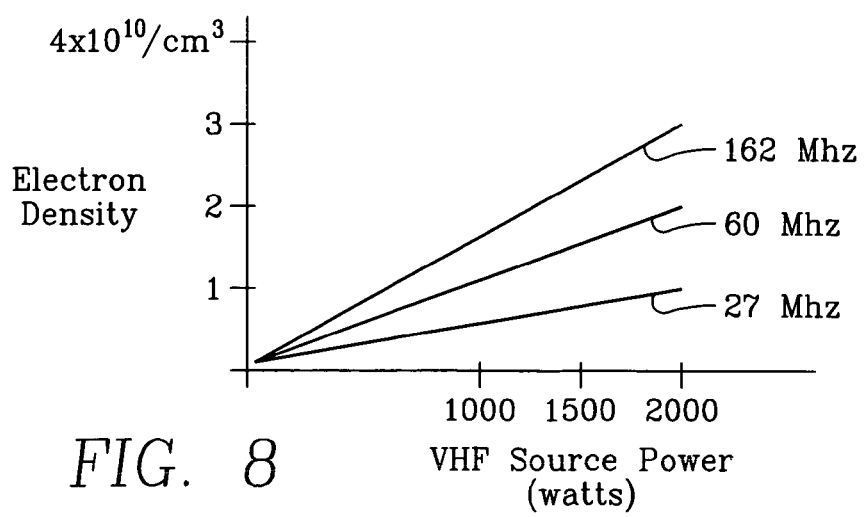
FIG. 8 is a graph illustrating the dependency of electron density in the bulk plasma as a function of source power levels for different VHF frequencies of the capacitively coupled power.

FIG. 8 is a graph depicting the effect of the selection of the frequency of the VHF capacitively coupled power source 122 upon ion density, in the step of block 210*c* of FIG. 2. FIG. 8 shows that ion density (and hence power coupling) increases with applied source power at a greater rate as the frequency is increased (e.g., from 27 MHz, to 60 MHz and then to 200 MHz). Thus, one way of affecting plasma ion density and the balance between capacitive and inductively coupled power is to select or control the VHF frequency of the capacitively coupled source RF generator 122.

Figure 9A:
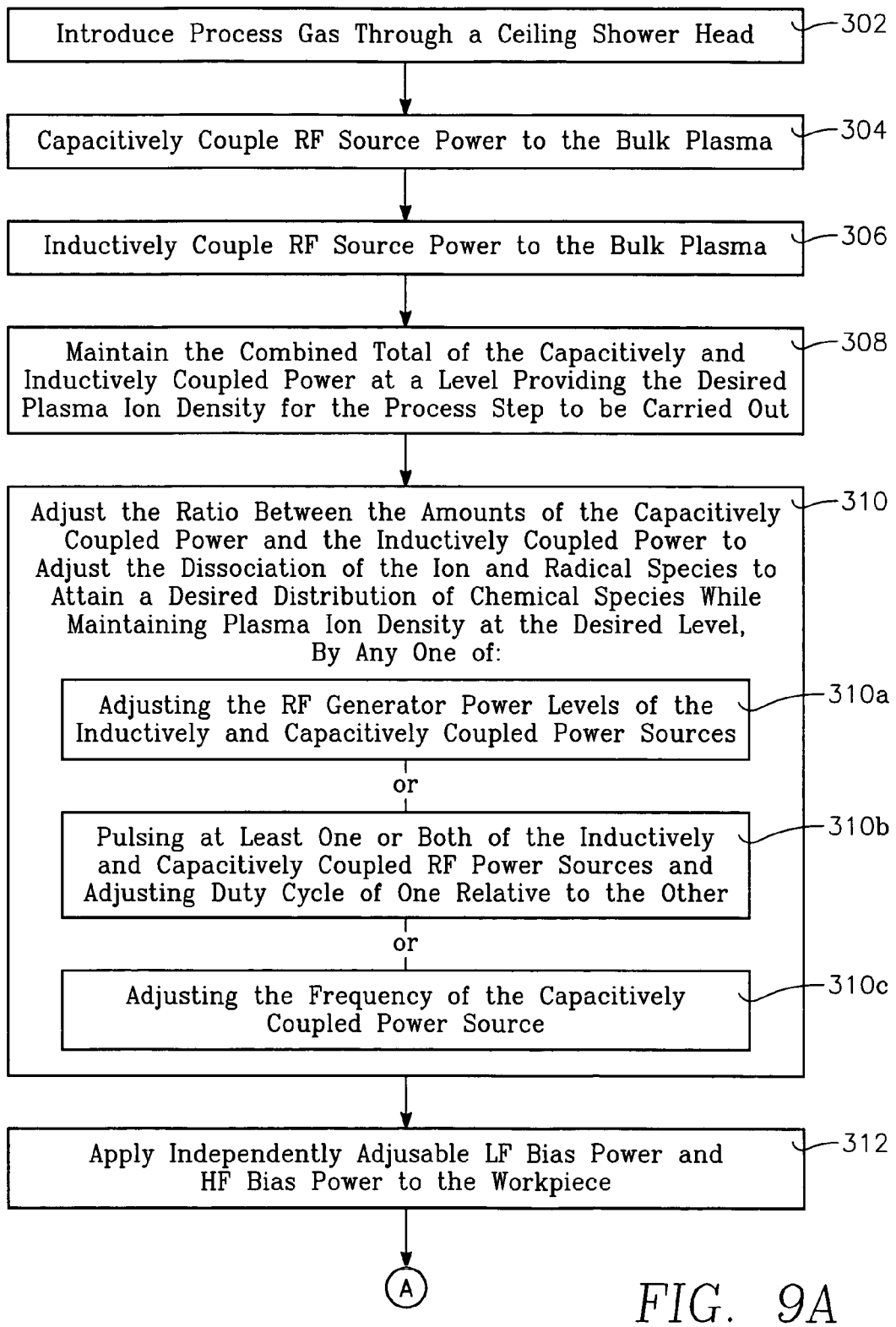
FIGS. 9A and 9B together constitute a block diagram depicting a method of another embodiment of the invention, and are hereinafter referred to collectively as "FIG. 9".
Figure 9B:
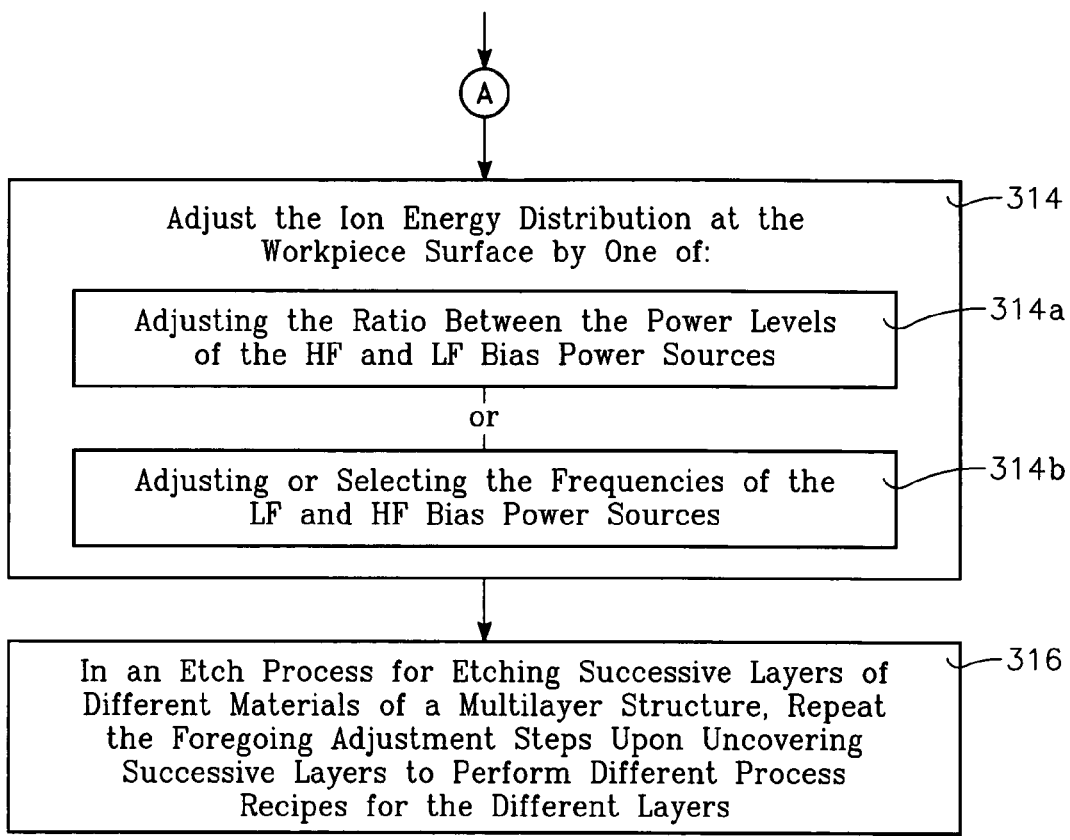

FIG. 9 depicts a modification of the method of FIG. 2 in which a desired plasma ion density is maintained while the inductive-to-capacitive coupling ratio discussed above is employed to achieve a desired level of dissociation or chemical species content of the plasma. The method of FIG. 9 includes introducing process gas, preferably through the ceiling gas distribution showerhead 109 (block 302 of FIG.

9). The method continues by capacitively coupling RF source power to the bulk plasma (block 304) while inductively coupling RF source power to the bulk plasma (block 306). The user establishes a certain plasma ion density in accordance with a particular process step. This is accomplished by maintaining the combined total of the capacitively coupled power and the inductively coupled power at a level providing the desired plasma ion density for the process step to be carried out (block 308). At the same time, the degree of dissociation in the bulk plasma is determined (e.g., to satisfy a certain process requirement) while maintaining the desired plasma ion density. This is accomplished by adjusting the ratio between the amounts of the VHF capacitively coupled power and the inductively coupled power (block 310). This fixes the dissociation (kinetic electron energy in the bulk plasma) between a very high level characteristic of an inductively coupled plasma and a lower level characteristic of a VHF capacitively coupled plasma. Such apportionment can be accomplished without perturbing the ion density by maintaining the total RF power nearly constant while changing only the ratio between the power delivered by the HF and VHF generators 118, 122, in accordance with the methods described above with reference to FIG. 6 and (or) FIG. 7.

The adjustment of step 310 can be carried out by any one (or a combination) of the following step: A first type of adjustment consists of adjusting the RF generator power levels of the inductively and capacitively coupled power sources 118, 122 (block 310a of FIG. 9). Another type consists of pulsing at least one or both of the inductively and capacitively coupled RF power generators 118, 122 and adjusting the duty cycle of one relative to the other (block 310b of FIG. 9). A third type consists of adjusting the effective frequency of the capacitively coupled power VHF generator 122 (block 310c of FIG. 9), in which plasma ion density increases as the VHF frequency is increased. Changing the effective VHF frequency can be carried out by providing a pair of fixed frequency VHF generators 122a, 122b having respective frequencies and adjusting the ratio between their output power levels.

The method further includes coupling independently adjustable LF bias power and HF bias power supplies to the workpiece (block 312). The controller 142 adjusts the ion energy level and ion energy distribution (width or spectrum) at the workpiece surface by simultaneous adjustments of the two RF bias power generators 132, 134 (block 314). This step is carried out by any one of the following: One way is to adjust the ratio between the power levels of the HF and LF bias power sources 132, 134 (block 314a of FIG. 9). Another way is to adjusting or selecting the frequencies of the LF and HF bias power sources (block 314b of FIG. 9).

The method is useful for performing plasma enhanced etch processes, plasma enhanced chemical vapor deposition (PECVD) processes, physical vapor deposition processes and mask processes. If the method is used in an etch process for etching successive layers of different materials of a multilayer structure, the plasma processes for etching each of the layers may be customized to be completely different processes. One layer may be etched using highly dissociated ion and radical species while another layer may be etched in a higher density plasma than other layers, for example. Furthermore, if chamber pressure is changed between steps, the effects of such a change upon radial ion density distribution may be compensated in order to maintain a uniform distribution. All this is accomplished by repeating the foregoing adjustment steps upon uncovering successive layers of the multilayer structure (block 316).

The superior uniformity of plasma ion radial distribution achieved by combining inductively coupled source power and VHF capacitively coupled source power makes it unnecessary to provide a large ceiling-to-wafer distance. Therefore, the ceiling-to-wafer distance may be reduced without compromising uniformity. This may be done when the reactor is constructed, or (preferably) the wafer support 103 may be capable of being lifted or lowered relative to the ceiling 108 to change the ceiling-to-wafer distance. By thus decreasing the chamber volume, the process gas residency time is decreased, providing independent control over dissociation and plasma species content. Also, reducing the ceiling-to-wafer distance permits the gas distribution effects of the gas distribution showerhead 109 to reach the wafer surface before being masked by diffusion, a significant advantage. Thus, another step of the method consists of limiting the ceiling-to-wafer distance to either (a) limit residency time or (b) prevent the showerhead gas distribution pattern from being masked at the wafer surface by diffusion effects (block 318 of FIG. 9).

The chemical species content of the plasma may be adjusted or regulated independently of the foregoing adjustments by adjusting the process gas residency time in the chamber, in the step of block 320 of FIG. 9. This step may be carried out by adjusting the rate at which the chamber 104 is evacuated by the vacuum pump 160 (block 320a of FIG. 9), for example by controlling the valve 162, in order to change the process gas residency time in the chamber. (Dissociation increases with increasing residency time.) Alternatively (or additionally), the adjustment of dissociation may be carried out by adjusting the ceiling-to-wafer distance so as to alter the process gas residency time in the chamber (block 320b of FIG. 9). This may be accomplished by raising or lowering the workpiece support 102 of FIG. 1. The foregoing measures for adjusting dissociation in the plasma do not significantly affect the ratio of inductive and capacitive coupling that was established in the step of block 310. Thus, the adjustment of the dissociation or chemical species content of step 320 is made substantially independently of (or in addition to) the adjustment of dissociation of step 210.

In an alternative embodiment, the capacitively coupled source power applicator 116 consists of electrodes in both the ceiling 108 and the workpiece support 103, and VHF power is applied simultaneously through the electrodes in both the ceiling 108 and the workpiece support 103. The advantage of this feature is that the phase of the VHF voltage (or current) at the ceiling may be different from the phase at the workpiece support, and changing this phase different changes the radial distribution of plasma ion density in the chamber 104. Therefore, the radial distribution of plasma ion density may be adjusted independently of the dissociation (i.e., without changing the capacitive-to-inductive coupling ratio selected in the step of block 310) by adjusting the phase difference between the VHF voltage (or current) at the workpiece support 103 and the VHF voltage (or current) at the ceiling 108. This is indicated in block 330 of FIG. 9.

Figure 10:
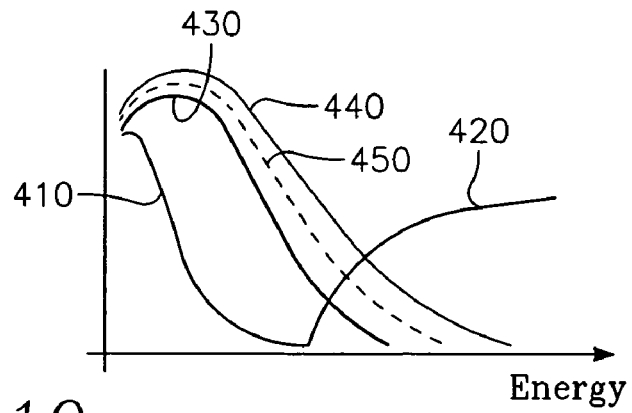
FIG. 10 is a graph illustrating different bulk plasma electron energy distribution functions obtained for different mixtures of capacitively and inductively coupled power.

FIG. 10 is a graph depicting how the ratioing of inductive and capacitive coupling controls dissociation in the bulk plasma in the step of block 308. Dissociation is promoted by an increase in electron energy within the bulk plasma, and FIG. 10 depicts the electron energy distribution function for four different operating regimes.

The curve labeled 410 depicts the electron energy distribution function in the case in which only the HF bias power is applied to the wafer and no source power is applied. In this case, the electron population is confined within a low energy spectrum, well below an energy at which the cross-section for a typical dissociation reaction (represented by the curve 420) has an appreciable magnitude. Therefore, less (if any) dissociation occurs.

The curve labeled 430 depicts the electron energy distribution function in the case in which VHF power is applied to the capacitively coupled source power applicator 116 and no power is applied to any other applicator. In this case, the electron population has a small component coinciding with the collision cross-section 420 and so a small amount of dissociation occurs.

The curve labeled 440 depicts the electron energy distribution function in the case in which HF power is applied to the inductively coupled source power applicator 114 and power is applied to no other applicator. In this case, the electron population has a component coinciding with a high value of the collision cross-section 420, and therefore a very high degree of dissociation occurs in the bulk plasma.

Figure 11:
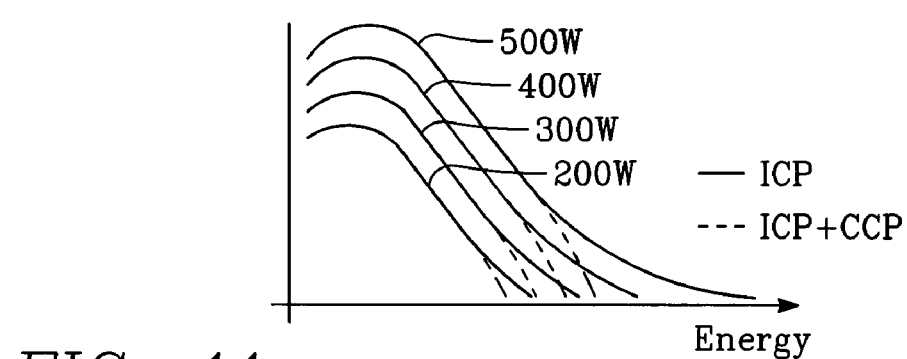
FIG. 11 depicts the change in electron energy distribution functions for different source power levels obtained when capacitively coupled power is added to inductively coupled power.

The curve labeled 450 depicts the electron energy distribution function for a case in which RF power is apportioned between the capacitive and inductively coupled applicators 116, 114. In this case, the resulting electron energy distribution function is mixture of the two functions 430, 440 and lies between them, so that a lesser amount of ion dissociation occurs in the bulk plasma. The curve 450 representing the combined case has a somewhat smaller electron population at or above an energy at which the collision cross-section 420 has a significant magnitude, leading to the lesser degree of dissociation. The combination case curve 450 can be shifted toward greater or lesser energy levels by changing the ratio between the amounts of capacitive and inductive coupled power. This is depicted in the graph of FIG. 11 in which each solid line curve corresponds to the electron energy distribution function for purely inductively coupled power at a particular power level. The dashed line curves extending from the solid line curves depict the modification of those curves as more power is diverted away from inductive coupling and applied to capacitive coupling. Essentially, this causes the electron population to shift to lower energy levels, thereby decreasing dissociation.

Figure 12:
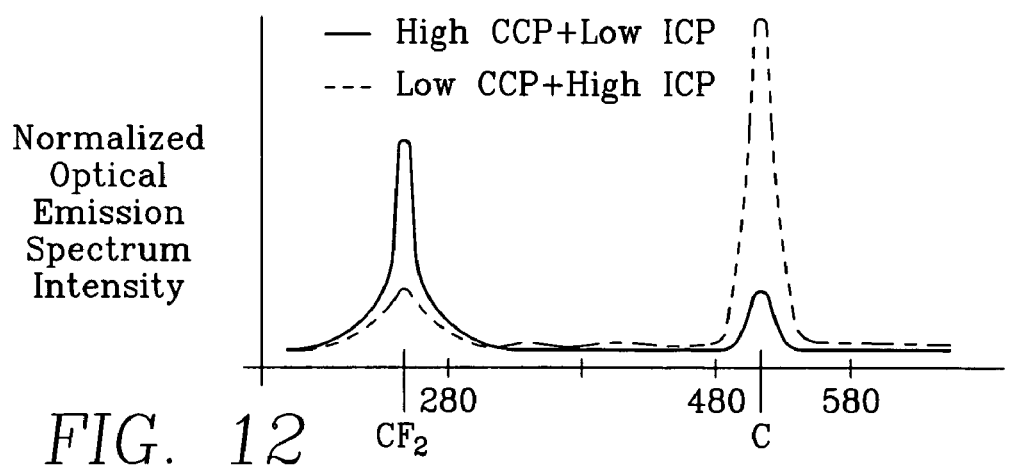
FIG. 12 depicts different optical emission spectra obtained for different degrees of dissociation (electron energy distributions).

FIG. 12 illustrates the effects of different levels of dissociation upon the chemical content of the plasma. The vertical axis represents the optical emission spectrum intensity and the horizontal axis represents wavelength. Different peaks correspond to the presence of certain radicals or ions, and the magnitude of the peak corresponds to the population or incidence in the plasma of the particular species. The solid line curve corresponds to a low degree of dissociation (capacitive coupling predominant), in which larger molecular species are present in large numbers. The dashed line curve corresponds to a high degree of dissociation (inductive coupling predominant), in which smaller (more reactive) chemical species are present in large numbers (depending upon the parent molecule). In the example illustrated in FIG. 12, a large molecular-weight species with high incidence in the predominantly capcitively coupled regime is $CF_2$, while a low molecular-weight species with high incidence in the predominantly inductively coupled regime is free carbon C. In some cases, the presence of C (free carbon) is an indicator of the presence of very light and highly reactive species, such as free fluorine, which may be desirable where a high etch rate is desired. The presence of the larger species such as $CF_2$ is an indicator of less dissociation and an absence of the more reactive species, which may be desirable in a plasma etch process requiring high etch selectivity, for example.

Figure 13:
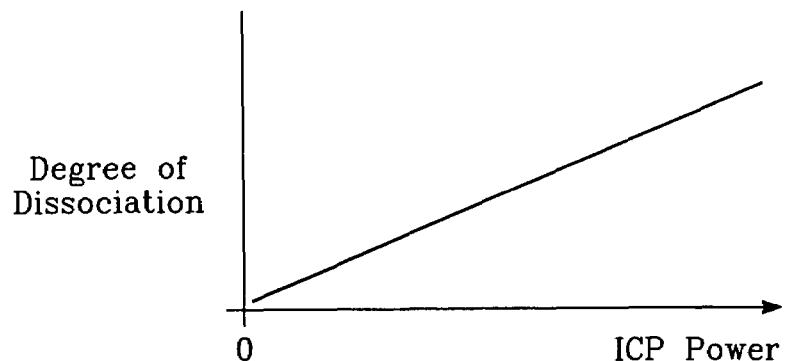
FIG. 13 is a graph depicting how the degree of dissociation (e.g., population of free carbon or free fluorine) increases with increasing ratio of inductively coupled power to capacitively coupled power.

FIG. 13 is a graph illustrating one way of carrying out the step of block 310*a* of FIG. 9. The vertical axis of FIG. 13 corresponds to the degree of dissociation in the bulk plasma, and may represent the optical emission spectrum intensity of a highly dissociated species such as free carbon in FIG. 12. The horizontal axis is the ratio of inductively coupled plasma (ICP) power to capacitively coupled plasma (CCP) power (the power levels of the ICP and CCP generators 118, 122 of FIG. 1). FIG. 13 indicates that the dissociation is a generally increasing function of this ratio, although it may not be the simple linear function depicted in FIG. 13.

Figure 14:
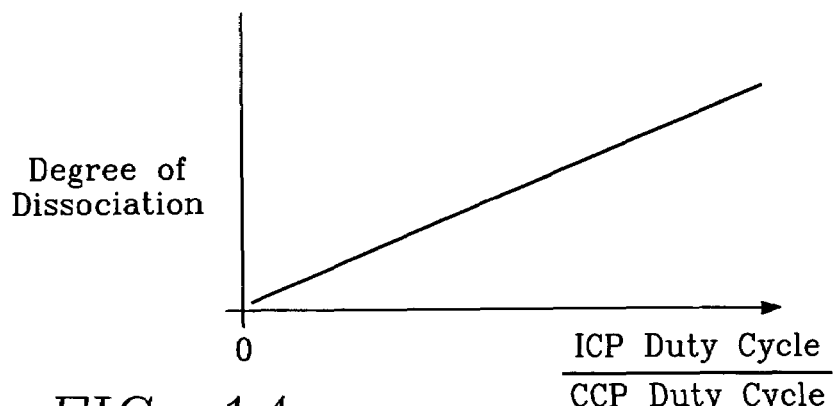
FIG. 14 is a graph depicting how the degree of dissociation (e.g., population of free carbon or free fluorine) increases with increasing ratio of inductively coupled power pulsed duty cycle to capacitively coupled power duty cycle.
Figure 15A:
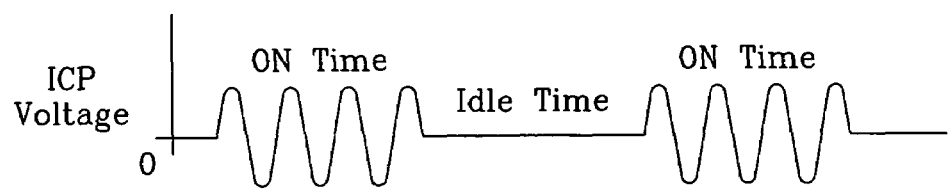
FIGS. 15A and 15B illustrate the contemporaneous waveforms of pulsed inductively coupled power and capacitively coupled power, respectively.
Figure 15B:
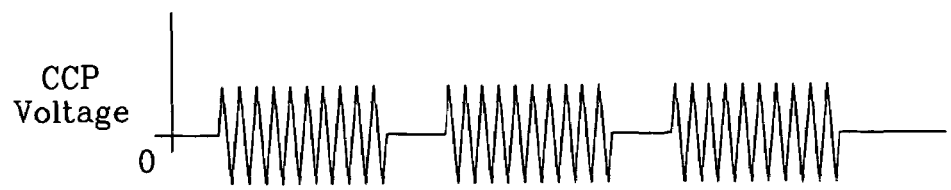

FIG. 14 is a graph illustrating one way of carrying out the step of block 310*b* of FIG. 9. The vertical axis of FIG. 14 corresponds to the degree of dissociation in the bulk plasma, and may represent the optical emission spectrum intensity of a highly dissociated species such as free carbon in FIG. 12. The horizontal axis is the ratio of inductively coupled plasma (ICP) pulsed duty cycle to capacitively coupled plasma (CCP) pulsed duty cycle (the pulsed duty cycles of the ICP and CCP generators 118, 122 of FIG. 1). FIG. 14 indicates that the dissociation is a generally increasing function of this ratio, although it may not be the simple linear function depicted in FIG. 14. The CCP generator 122 may not be pulsed, in which case its duty cycle is 100%, while only the ICP duty cycle is varied to exert control. FIGS. 15A and 15B illustrate one possible example of the contemporaneous waveforms of the pulsed ICP generator output and the pulsed CCP generator output. In this illustrated example, the CCP generator 122 has a higher duty cycle than the ICP generator 118, so that the plasma is likely to exhibit more the characteristics of a capacitively coupled plasma, such as a low degree dissociation. The ratio between the duty cycles of the capacitively and inductively coupled power sources affects the proportion between inductively and capacitively coupled power in the plasma in the following way. First, the shorter the duty cycle of the inductively coupled power source, the longer the idle time between the pulsed bursts of RF inductive power. During the idle time, the highest energy electrons in the bulk plasma loose their energy faster than other less energetic electrons, so that the electron energy distribution function (FIG. 10) shifts downward in energy (i.e., to the left in FIG. 10). This leads to a more capacitively coupled-like plasma (i.e., less dissociation) during each idle time. This effect increases as duty cycle is decreased, so that the plasma has (on average over many cycles) less high energy electrons, leading to less dissociation. During the idle time, the higher energy electron distribution decays, and (in addition) spatial distribution of the higher energy electrons has an opportunity to spread through diffusion, thus improving process uniformity to a degree depending upon the reduction in inductively coupled power duty cycle.

Figure 16:
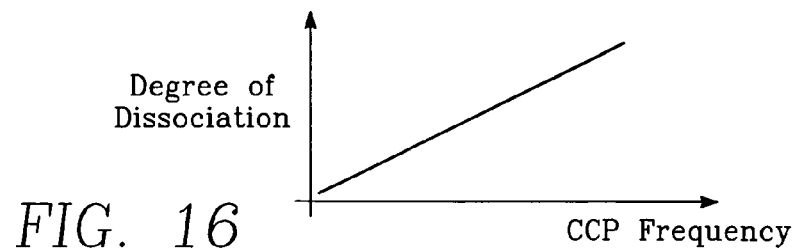
FIG. 16 is a graph illustrating how the degree of dissociation decreases with increasing frequency of capacitively coupled power.

FIG. 16 is a graph depicting one way of carrying out the step of block 310*c* of FIG. 9. The vertical axis of FIG. 16 corresponds to the degree of dissociation in the bulk plasma, and may represent the optical emission spectrum intensity of a highly dissociated species such as free carbon in FIG. 12. The horizontal axis is the frequency of the capacitively coupled plasma (CCP) generator 122 of FIG. 1. FIG. 16 corresponds to the case in which both CCP and ICP power is applied simultaneously, as in the previous examples, and the frequency of the CCP power generator 122 is increased. For a fixed level of ICP power and a fixed level of CCP power, increasing the effective VHF frequency increases the plasma dissociation, as indicated in FIG. 16. The dissociation behavior may not be the simple linear function depicted in FIG. 16.

Figure 17A:
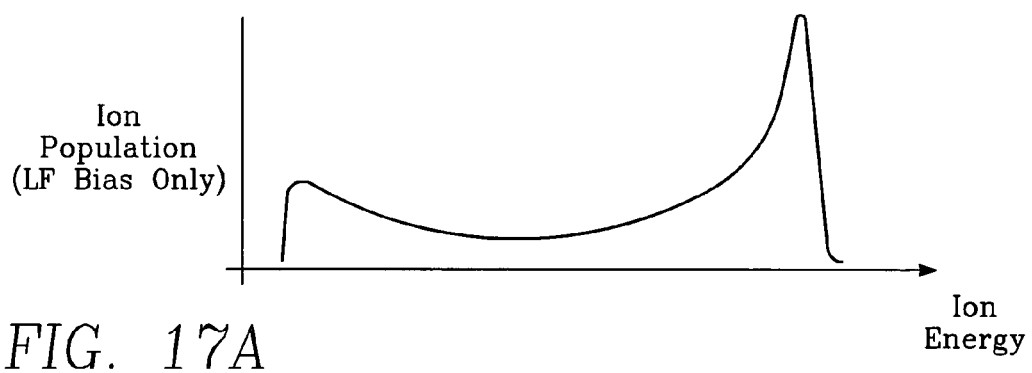
FIGS. 17A, 17B and 17C are graphs of sheath ion energy distribution for the cases in which only low frequency bias power is applied, only high frequency bias power is applied and both low and high frequency bias power is applied to the wafer, respectively.
Figure 17B:
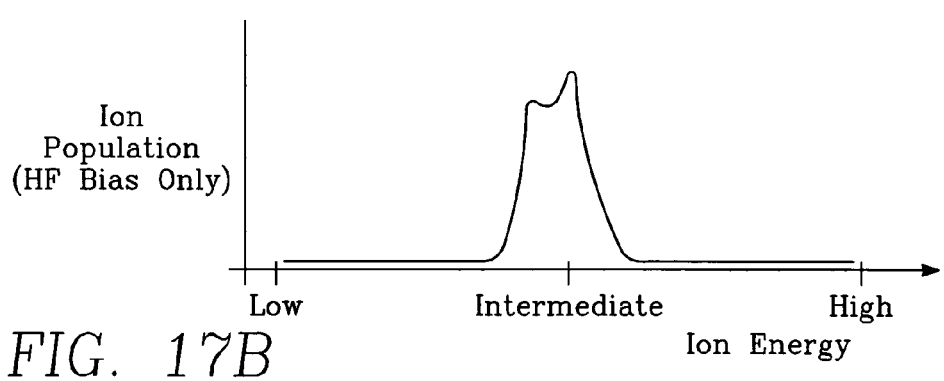
Figure 17C:
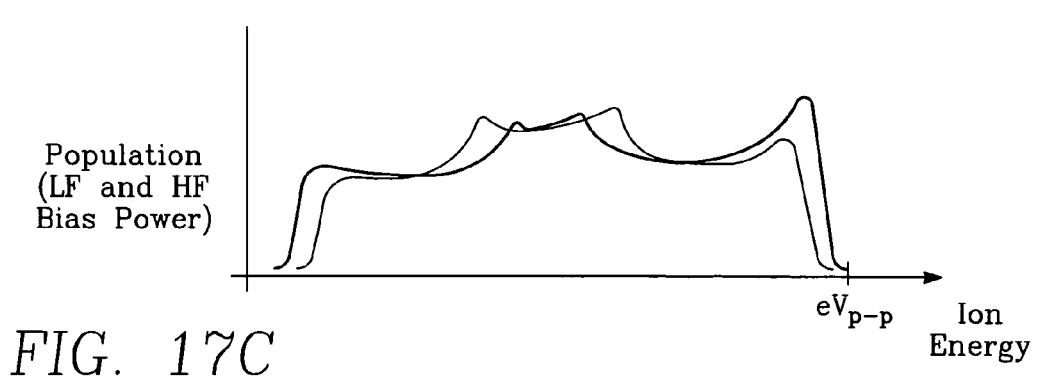

FIGS. 17A, 17B and 17C illustrate how the step of block 214 of FIG. 2 (which corresponds to or is the same as the step of block 314 of FIG. 9) is carried out. Each of the graphs of FIGS. 17A, 17B, 17C depicts the population of ions at the plasma sheath (at the workpiece surface) as a function of ion energy, or the sheath ion energy distribution.

FIG. 17A depicts the ion energy distribution in the case in which the only bias power that is applied to the wafer is a low frequency (e.g., 1 MHz) bias voltage or current. (In FIG. 1, this corresponds to the case in which only the LF bias power generator 132 applies bias power.) This frequency is substantially below the sheath ion transmit frequency, which is the highest frequency at which the sheath ions can follow an oscillation of the sheath electric field. Therefore, the sheath ions in the example of FIG. 17A can follow the peak-to-peak oscillations of the sheath electric field imposed by the bias power. This results in a peak ion energy that coincides with the RF bias power peak-to-peak voltage (labeled eVp-p in FIG. 17A). The ion energy distribution is bi-modal and has a second peak at a much lower energy, as depicted in the graph of FIG. 17A. The ion distribution between these two peaks is relatively low.

FIG. 17B depicts the ion energy distribution in the case in which the bias power consists only of a high frequency (HF) component (such as 13.56 MHz). (In FIG. 1, this corresponds to the case in which only the HF bias power generator 134 applies bias power.) This frequency is well above the sheath ion transmit frequency, and therefore the sheath ions are unable to follow the peak-to-peak sheath electric field oscillation. The result is that the ion energy distribution of FIG. 17B is confined to a narrow energy band centered at half of the peak-to-peak voltage of the sheath. The ion energy distributions of FIGS. 17A and 17B can be seen to be somewhat complementary to one another, with one distribution (FIG. 17B) being rich in a middle frequency band while the other (FIG. 17A) peaks at two extremes, has a wide distribution that is somewhat depleted at the middle frequencies.

FIG. 17C illustrates an example of an ion energy distribution that can be realized by applying both LF and HF bias power simultaneously (by enabling both bias power generators 132, 134 of FIG. 1). This results in an ion energy distribution that is, in effect, a superposition of the two extreme distributions of FIGS. 17A and 17B. The "combination" ion energy distribution of FIG. 17C is therefore adjustable by adjusting the relative amounts of LF and HF bias power. This is accomplished by either (or both) apportioning the power levels of the LF and HF bias power generators 132, 134 (as in step 214a of FIG. 2) or pulsing one or both of them and apportioning their duty cycles (as in step 214b of FIG. 2). Alternatively, or as an additional step, the frequency of either the HF or the LF bias power may be changed. For example, the LF bias power frequency may be increased to a value closer to the sheath ion transmit frequency, which would reduce the ion energy distribution population near the maximum energy (eVp-p) in FIG. 17C (thereby narrowing the ion energy distribution as indicated by the dotted line curve of FIG. 17C). As another example, the HF bias power frequency can be reduced to a value closer to the sheath ion transmit frequency, which would decrease the distribution peak at the intermediate energies of FIG. 17C (thereby broadening the ion energy distribution in the middle frequencies as indicated by the dashed line of FIG. 17C).

Figure 18:
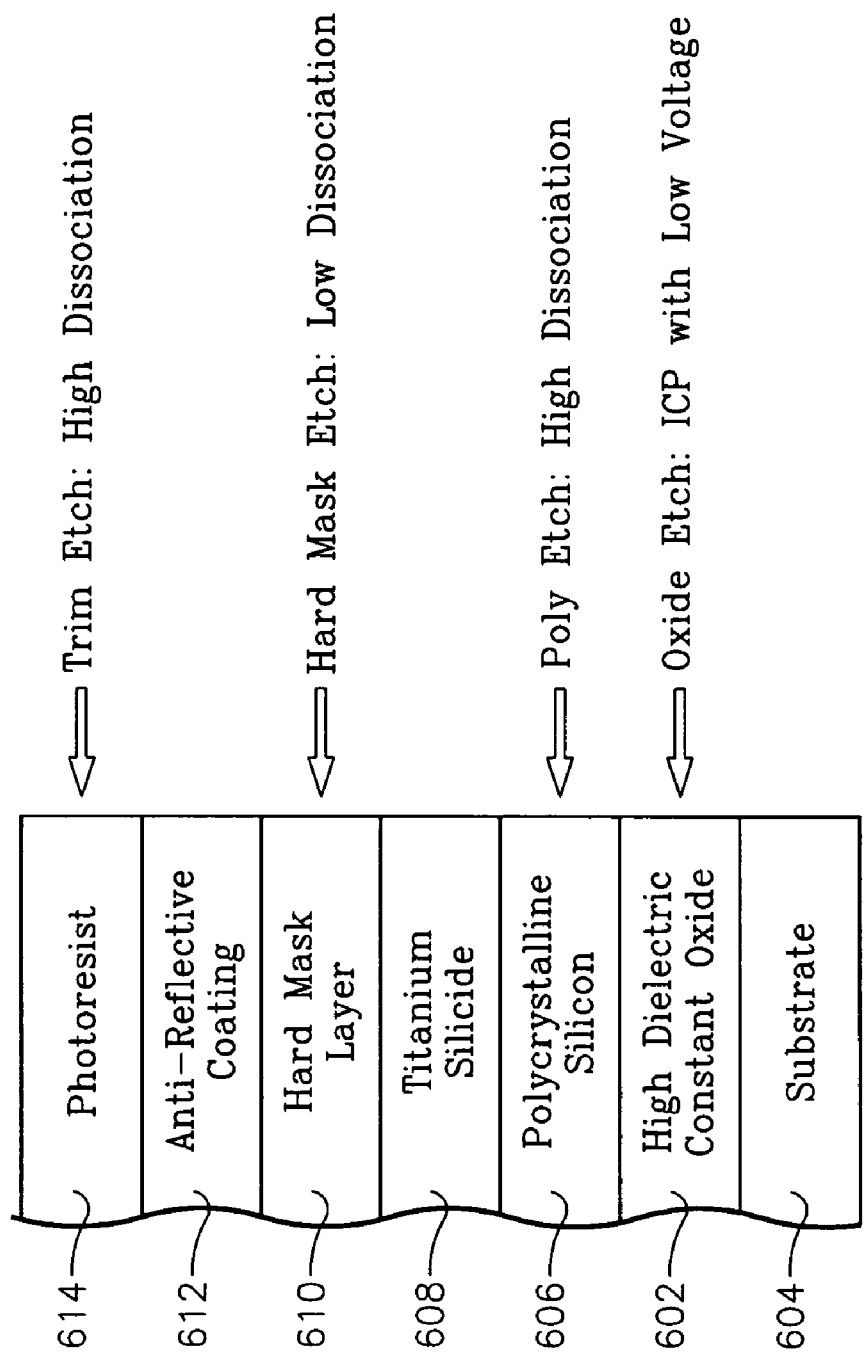
FIG. 18 illustrates a multi-layer gate structure which is to be etched in the process of FIG. 2 or FIG. 9.

FIG. 18 depicts a multilayer thin film structure of a typical gate of a typical field effect transistor (FET). These layers include a high dielectric constant silicon dioxide layer 602 overlying a semiconductor substrate 604, a polycrystalline silicon conductive layer 606 on the oxide layer 602, a titanium silicide layer 608 on the conductive layer 606, a hard mask layer 610 over the silicide layer 608, an anti-reflective (AR) coating 612 on the hard mask layer 610 and a photoresist layer 614 on the AR coating 612. In a plasma etch process for etching such a structure, the different materials of each of the layers 602-614 is best etched in a different etch process. Some of the layers (e.g., the photoresist layer 614 and the polycrystalline silicon conductive layer 606 are best etched in a plasma that is more inductively coupled than capacitively coupled, while other layers (e.g., the hard mask layer 610) are best etched in plasma that is more capacitively coupled than inductively coupled. Using the methods of FIG. 2 or FIG. 9, each of the different layers may be processed (e.g., etched) with the type of plasma process conditions that are optimal for that particular layer, by changing the process conditions, including the type of source power coupling (i.e., changing the ratio between inductively and capacitively coupled source power). Thus, in an etch process, as each successive layer 602-614 is exposed, the adjustments described with reference to FIGS. 1 and 9 are repeated to change the process parameters to customize the process for each layer. This is the goal of the step of blocks 216 and 316 of FIGS. 2 and 9 respectively. In making such changes, other process parameters may be changed. For example, a predominantly inductively coupled plasma of the type used to etch the polycrystalline layer 606 may be better maintained at a lower chamber pressure (e.g., a several milliTorr), while a predominantly capacitively coupled plasma may be better maintained at a higher chamber pressure (e.g., tens of milliTorr). Plasmas having nearly the same amount of inductively and capacitively coupled power may be operated at chamber pressures intermediate the higher chamber pressure range of a capacitively coupled plasma and the lower pressure range of an inductively coupled plasma. Moreover, different bias power levels and ion energy distributions may be employed to etch different ones of the layers 602-614, using the steps of blocks 214 or 314 of FIG. 1 or 9 to make the adjustments.

Advantages:

The simultaneous application of both VHF capacitively coupled power and inductively coupled power to the plasma enables the user to independently control plasma ion density and either plasma uniformity or dissociation (or chemical species content of the plasma). Conventional reactors compensate for the center-low ion density distribution of an inductively coupled plasma by applying power from the ceiling using a high ceiling-to-wafer distance so that diffusion effects produce a uniform plasma ion distribution at the wafer. However, such a large ceiling-to-wafer distance would mask the desired effects of an overhead gas distribution showerhead at the wafer surface, so that the benefits of an overhead gas distribution showerhead could not be realized in an inductively coupled reactor. Another problem is that the large ceiling-to-wafer spacing renders the chamber volume very large, so that the process gas residency time is correspondingly large (unless an extremely high capacity vacuum pump evacuates the chamber), making it difficult to control dissociation in the bulk plasma below a minimum level. This has made it more difficult to minimize or solve etch processing problems such as etch microloading or lack of etch selectivity. These problems are all solved in the invention. The seeming inability to employ an overhead gas showerhead in an inductively coupled reactor to improve process uniformity at the wafer surface is solved by introducing an ideal amount of capacitively coupled power to make the ion distribution uniform in the ion generation region. This permits the ceiling-to-wafer spacing to be greatly reduced to the point that an overhead gas showerhead controls process uniformity at the wafer surface. Etch selectivity is improved and etch microloading is reduced by reducing dissociation in the plasma through the reduced gas residency time of the smaller chamber volume facilitated by the reduced ceiling-to-wafer distance. In addition, the etch microloading problem may be solved by independent means by selecting a desired chemical content of the plasma by promoting the degree of dissociation that promotes the desired chemical species. Certain chemical species can suppress the effects of etch microloading, and by adjusting the ratio of the capacitively coupled power to inductively coupled power, the dissociation may be varied to maximize the amount of the desired species present in the plasma. Another advantage is that all of this can be performed while maintaining the overall plasma ion density at a desired level, or independently adjusting plasma ion density.

Figure 19:
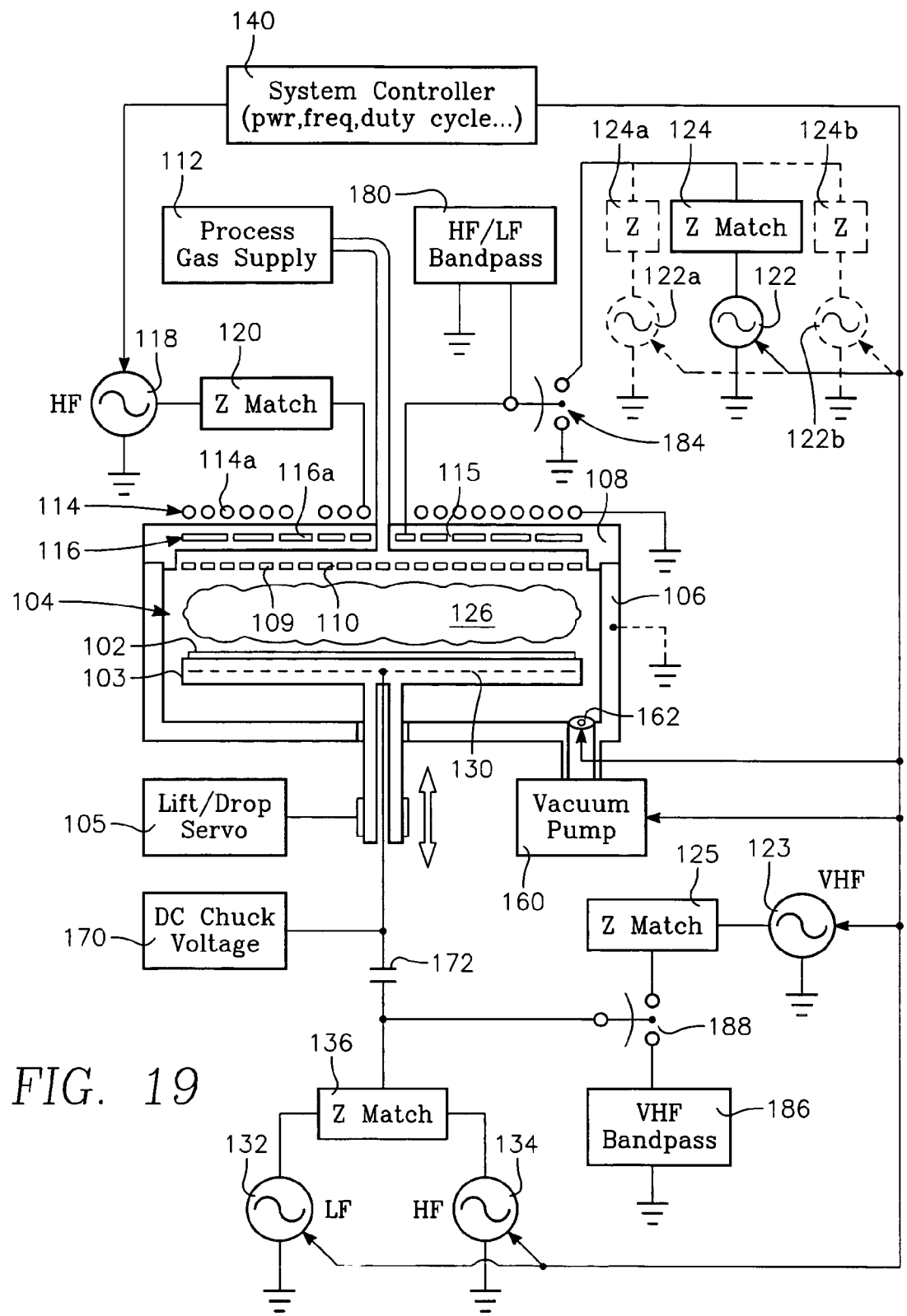
FIG. 19 illustrates a plasma reactor in accordance with a first embodiment.
Figure 20:
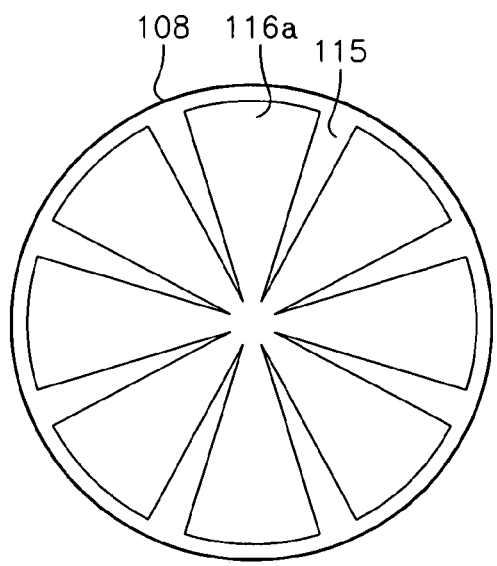
FIGS. 20 and 21 illustrate different implementations of a ceiling electrode in the reactor of FIG. 19.
Figure 21:
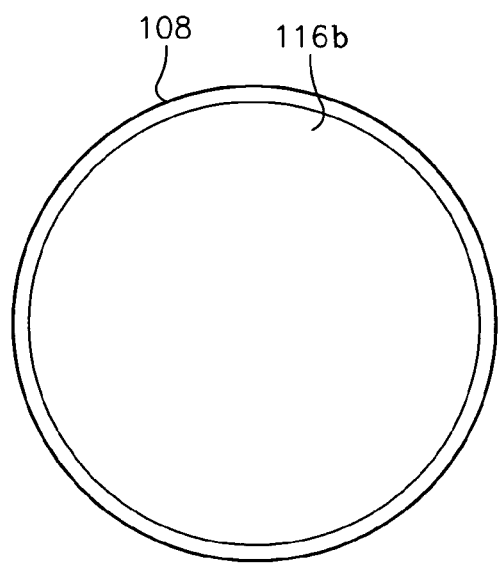
Figure 22:
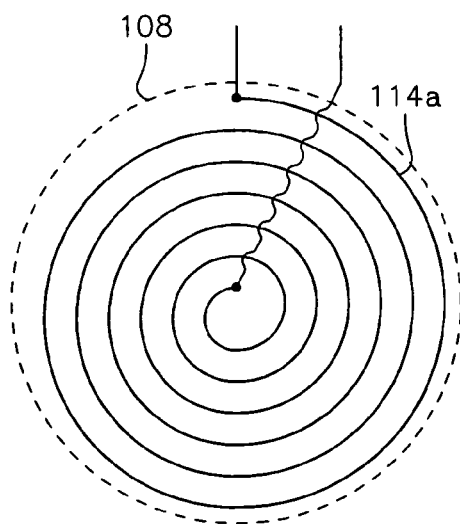
FIGS. 22 and 23 illustrate different embodiments of the inductive antenna of the reactor of FIG. 19.
Figure 23:
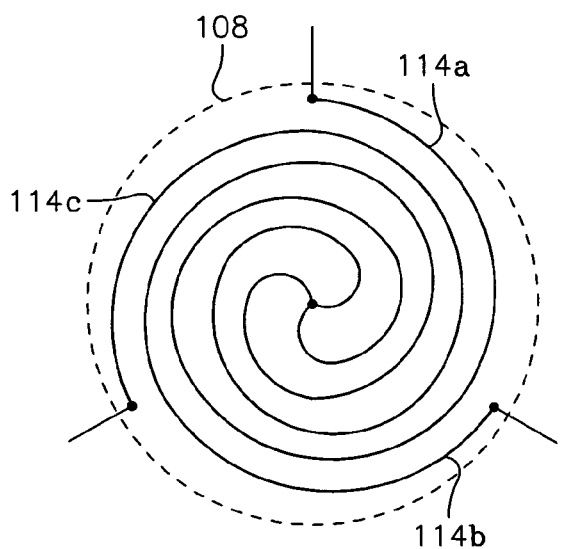

Apparatus:

FIG. 19 illustrates a first embodiment of a plasma reactor of the invention for processing a workpiece 102, which may be a semiconductor wafer, held on a workpiece support 103 within a reactor chamber 104. Optionally, the workpiece support 103 be raised and lowered by a lift servo 105. The chamber 104 is bounded by a chamber sidewall 106 and a ceiling 108. The ceiling 108 may include a gas distribution showerhead 109 having small gas injection orifices 110 in its interior surface, the showerhead 109 receiving process gas from a process gas supply 112. The reactor includes an inductively coupled RF plasma source power applicator 114. As illustrated in FIG. 22, the inductively coupled power applicator may consist of a conductive coil 114a wound in a helix and lying over the ceiling 108 in a plane parallel to the ceiling 108. Alternatively, as depicted in FIG. 23, the conductive coil may consist of parallel helically wound conductors 114b, 114c, 114d. A capacitively coupled RF plasma source power applicator 116, in one embodiment, is an electrode 116a in the ceiling overlying the gas distribution showerhead. In another embodiment, the capacitively coupled plasma source power applicator 116 is an electrode 130 within the workpiece support 130. In order to permit inductive coupling into the chamber 104 from the coil antenna 114a, the gas distribution showerhead 109 may be formed of a dielectric material such as a ceramic. The ceiling electrode 116a preferably has multiple radial slots 115 as illustrated in FIG. 20 to permit inductive coupling into the chamber 104 from the overhead coil antenna 114a into the chamber. Alternatively, a ceiling electrode 116b depicted in FIG. 21 may be employed that is not slotted and instead is formed of a material capable of functioning as an electrode while at the same time permitting inductive coupling of RF power from the overhead coil antenna 114. One example of such a material is a doped semiconductor.

In an alternative embodiment, the capacitively coupled source power applicator 116 may include both the electrode 116a within the ceiling 108 and the electrode 130 within the workpiece support 103, so that RF source power may be capacitively coupled simultaneously from the ceiling 108 and the workpiece support 103. In yet another alternative embodiment, both electrodes 116a and 130 are present, but VHF source power is applied to only one of them while the other serves as an VHF return or counter electrode.

An RF power generator 118 provides high frequency (HF) power (e.g., within a range of about 10 MHz through 27 MHz) through an impedance match element 120 to the inductively coupled coil antenna 114a. In one embodiment in which the ceiling electrode 116a is the capacitively coupled source power applicator, an RF power generator 122 provides very high frequency (VHF) power (e.g., within a range of about 27 MHz through 200 MHz) through an impedance match element 124 to the capacitively coupled power applicator 116. In another embodiment in which the bottom (workpiece support) electrode 130 is the capacitively coupled source power applicator, an RF power generator 123 provides VHF power through an impedance match element 125 to the bottom electrode 130. In a third embodiment, both the ceiling and bottom electrodes 116a, 130 comprise the capacitively coupled plasma source power applicator, so that both VHF generators 122, 123 are present. In a further embodiment, both electrodes 116a, 130 are present, but VHF plasma source power is applied to only one them, while the other is coupled to the VHF return potential (e.g., ground) in order to serve as a counterelectrode for the other.

The efficiency of the capacitively coupled power source applicator 116 in generating plasma ions increases as the VHF frequency increases, and the frequency range preferably lies in the VHF region for appreciable capacitive coupling to occur. Power from both RF power applicators 114, 116 is coupled to a bulk plasma 126 within the chamber 104 formed over the workpiece support 103.

RF plasma bias power is coupled to the workpiece 102 from an RF bias power supply coupled to the electrode 130 inside the workpiece support and underlying the wafer 102. The RF bias power supply may include a low frequency (LF) RF power generator 132 (100 kHz to 4 MHz) and another RF power generator 134 that may be a high frequency (HF) RF power generator (4 MHz to 27 MHz). An impedance match element 136 is coupled between the bias power generators 132, 134 and the workpiece support electrode 130. A vacuum pump 160 evacuates process gas from the chamber 104 through a valve 162 which can be used to regulate the evacuation rate. The evacuation rate through the valve 162 and the incoming gas flow rate through the gas distribution showerhead 109 determine the chamber pressure and the process gas residency time in the chamber. If the workpiece support 103 is an electrostatic chuck, then a D.C. chucking voltage supply 170 is connected to the electrode 130. A capacitor 172 isolates the RF generators 123, 132, 134 from the D.C. voltage supply 170.

In the first embodiment, VHF power is applied only to the ceiling electrode 116a. In this case, it may desirable for the workpiece support electrode 130 to function as the return path for the VHF power applied to the ceiling electrode 116a and for the ceiling electrode to function as the return path for the HF power applied to the workpiece support electrode 130. For this purpose, the ceiling electrode 116a may be connected through an LF/HF bandpass filter 180 to ground. The bandpass filter 180 prevents VHF from the generator 122 from being diverted from the ceiling electrode 116a to ground. Similarly, the wafer support electrode 130 may be connected (via the RF isolation capacitor 172) to ground through a VHF bandpass filter 186. The VHF bandpass filter 186 prevents LF and HF power from the generators 132, 134 from being diverted from the electrode 130 to ground.

In the second embodiment, VHF power is applied to only the wafer support electrode 130. In this case, the wafer support electrode 130 is not connected to ground, but rather to the VHF generator 123 (via the match 125), so that the VHF bandpass filter 186 is eliminated. Likewise, the LF/HF bandpass filter 180 may be bypassed (or eliminated) and the ceiling electrode 116a connected directly to ground. The foregoing options are indicated symbolically by the switches 184, 188 in FIG. 19. It is understood that the reactor may be permanently configured in accordance with one of the first or second embodiments rather than being configurable (by the switches 184, 188) into either embodiment, so that only one of the VHF generators 122, 123 would be present, and the switches 184, 188 would be unnecessary in such a case.

In the third embodiment, both electrodes 116a, 130 are driven simultaneously by the VHF generators 122, 123 so that neither could be a VHF ground. However, the ceiling electrode 116a could be connected through the LF/HF bandpass filter 180 to ground in order to be a counterelectrode or return for LF/HF bias power applied to the wafer support electrode 130. In this embodiment, the side wall 106 may provide a ground return for the VHF power. If the VHF phase between the two electrodes 130, 116a is different, then each electrode may provide some reference potential for at least a portion of each RF cycle. For example, the VHF phase difference between the two electrodes 116a, 130 were 180 degrees, then each electrode 116a, 130 would function as a counterelectrode for the other during the entirety of each RF cycle. The two VHF generators 122, 123 may be realized in a single VHF generator, with a source power controller 140 governing the difference in phase between the VHF voltages or the VHF currents delivered by the single generator to the respective electrodes 116b, 130.

The source power controller 140 regulates the source power generators 118, 122 independently of one another in order to control bulk plasma ion density, radial distribution of plasma ion density and dissociation of radicals and ions in the plasma. The controller 140 is capable of independently controlling the output power level of each RF generator 118, 122. In addition, or alternatively, the controller 140 is capable of pulsing the RF output of either one or both of the RF generators 118, 122 and of independently controlling the duty cycle of each, or of controlling the frequency of the VHF generator 122 and, optionally, of the HF generator 118. The controller 140 may also control the pumping rate of the vacuum pump 160 and/or the opening size of the evacuation valve 162. In addition, a bias power controller 142 controls the output power level of each of the bias power generators 132, 134 independently. The controllers 140, 142 are operated to carry out the various methods of the invention described above.

Figure 24:
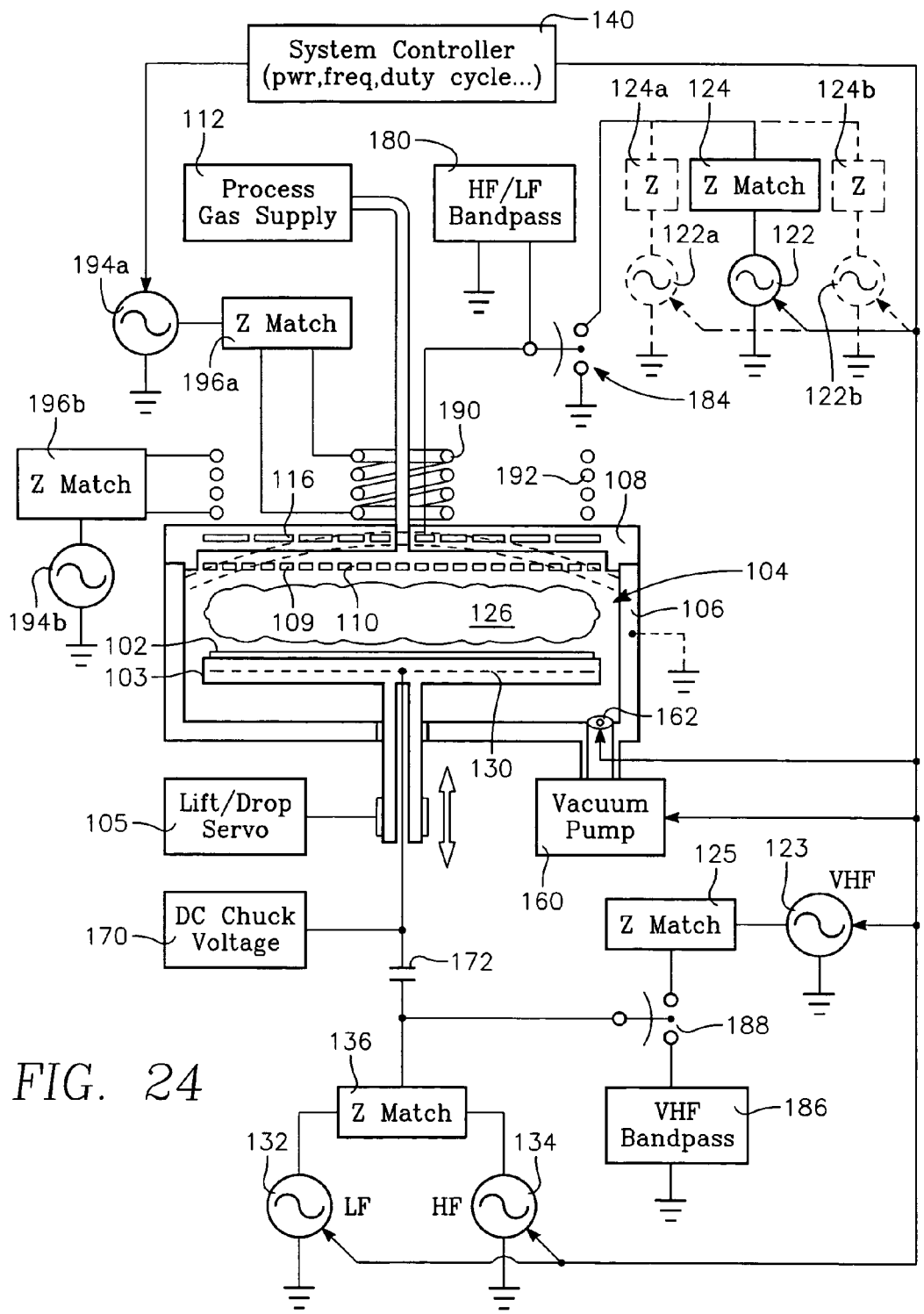
FIG. 24 illustrates a plasma reactor in accordance with another embodiment.
Figure 25:
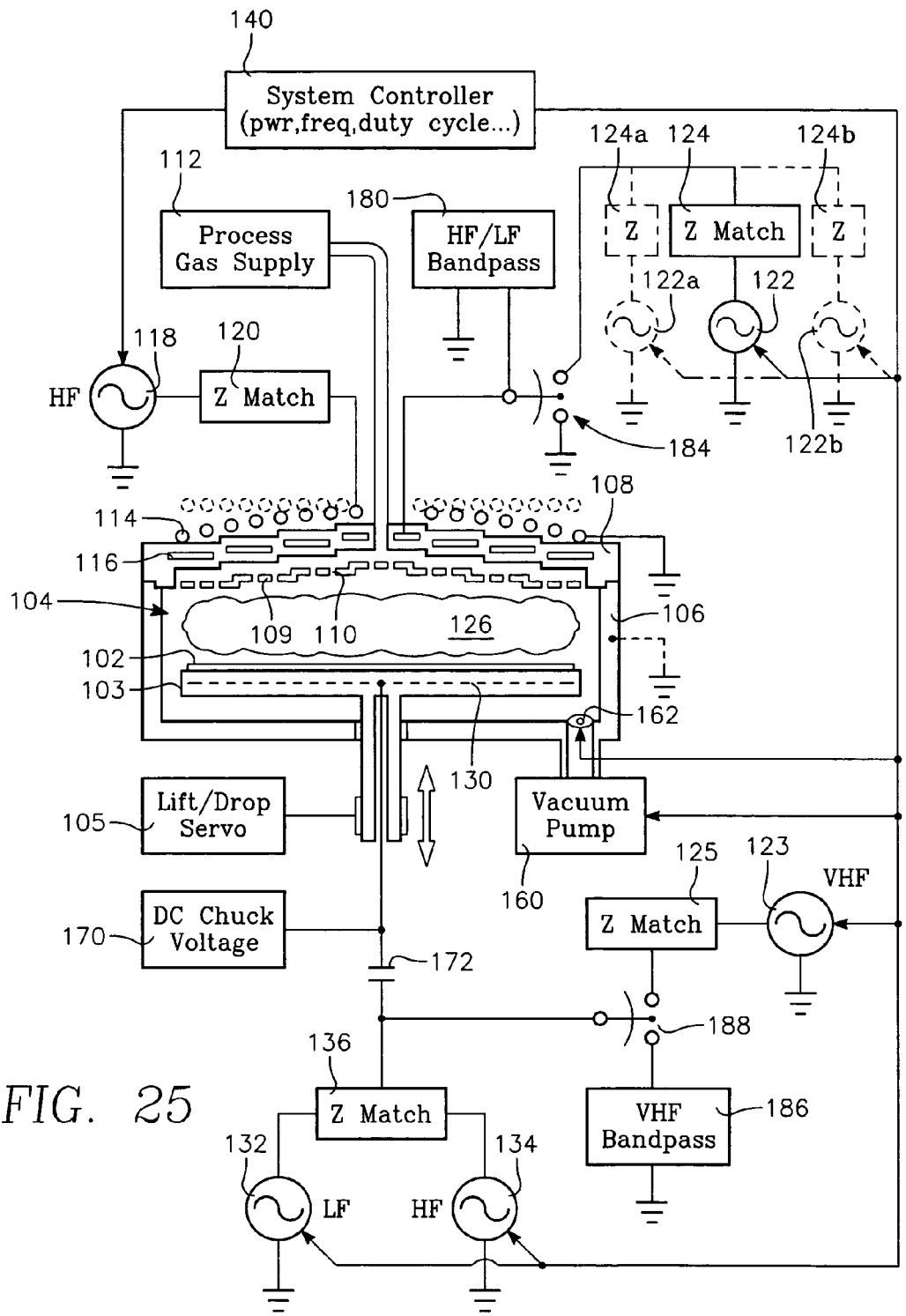
FIG. 25 illustrates a plasma reactor in accordance with yet another embodiment.
Figure 26:
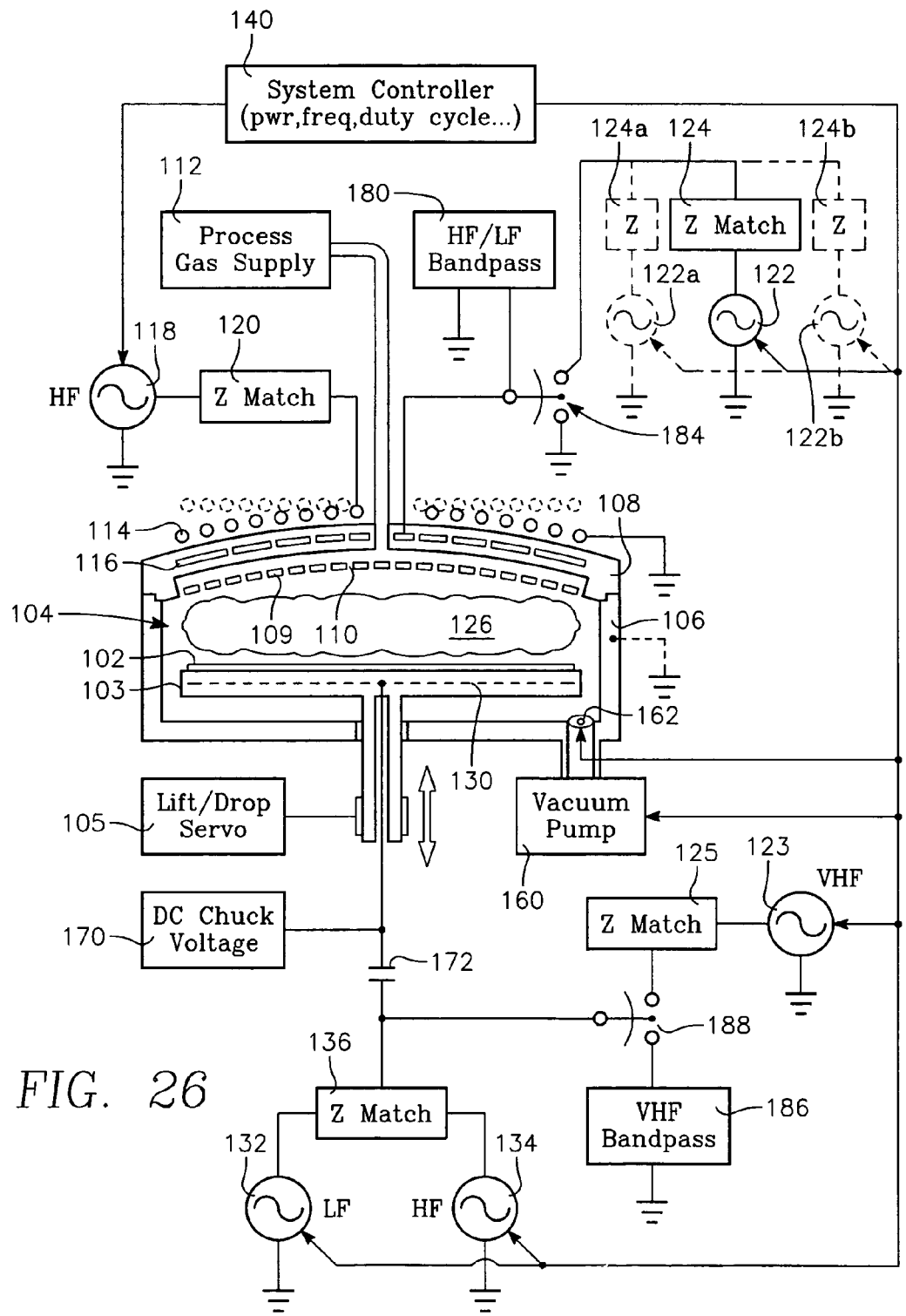
FIG. 26 illustrates a plasma reactor in accordance with a further embodiment.

FIG. 24 illustrates another modification of the embodiment of FIG. 19 in which the coil antenna 114a includes one (or more) solenoidal conductor windings 190, 192 fed by respective RF generators 194a, 194a through respective impedance matches 196a, 196b. In this case, the ceiling 108 and showerhead 109 may be either flat (solid line) or dome shaped (dotted line). FIG. 25 depicts a modification of the embodiment of FIG. 19 in which the ceiling 108 and gas distribution showerhead 109 have a center-high stepped shaped. In this case the coil antenna 114a can assume either a flat shape (dotted line) or a hemispherical (or dome) shape as shown in solid line in FIG. 25. FIG. 26 depicts another modification of the embodiment of FIG. 19 in which the ceiling 108 and the gas distribution showerhead 109 are hemispherical or dome shaped. Again, the coil antenna 114a be flat (dotted line) or dome shaped (solid line).

Figure 27:
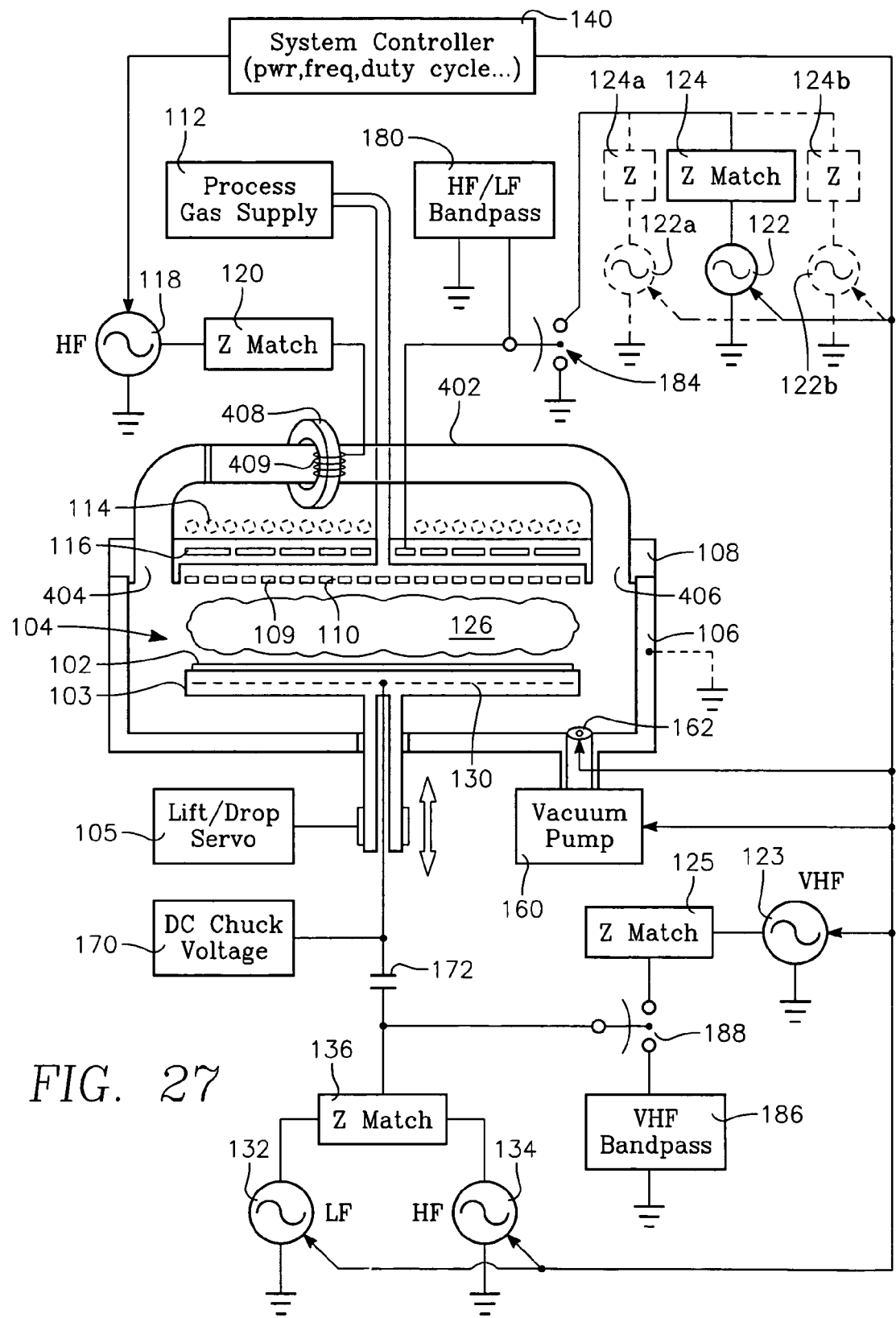
FIG. 27 illustrates a plasma reactor in accordance with a yet further embodiment.
Figure 28:
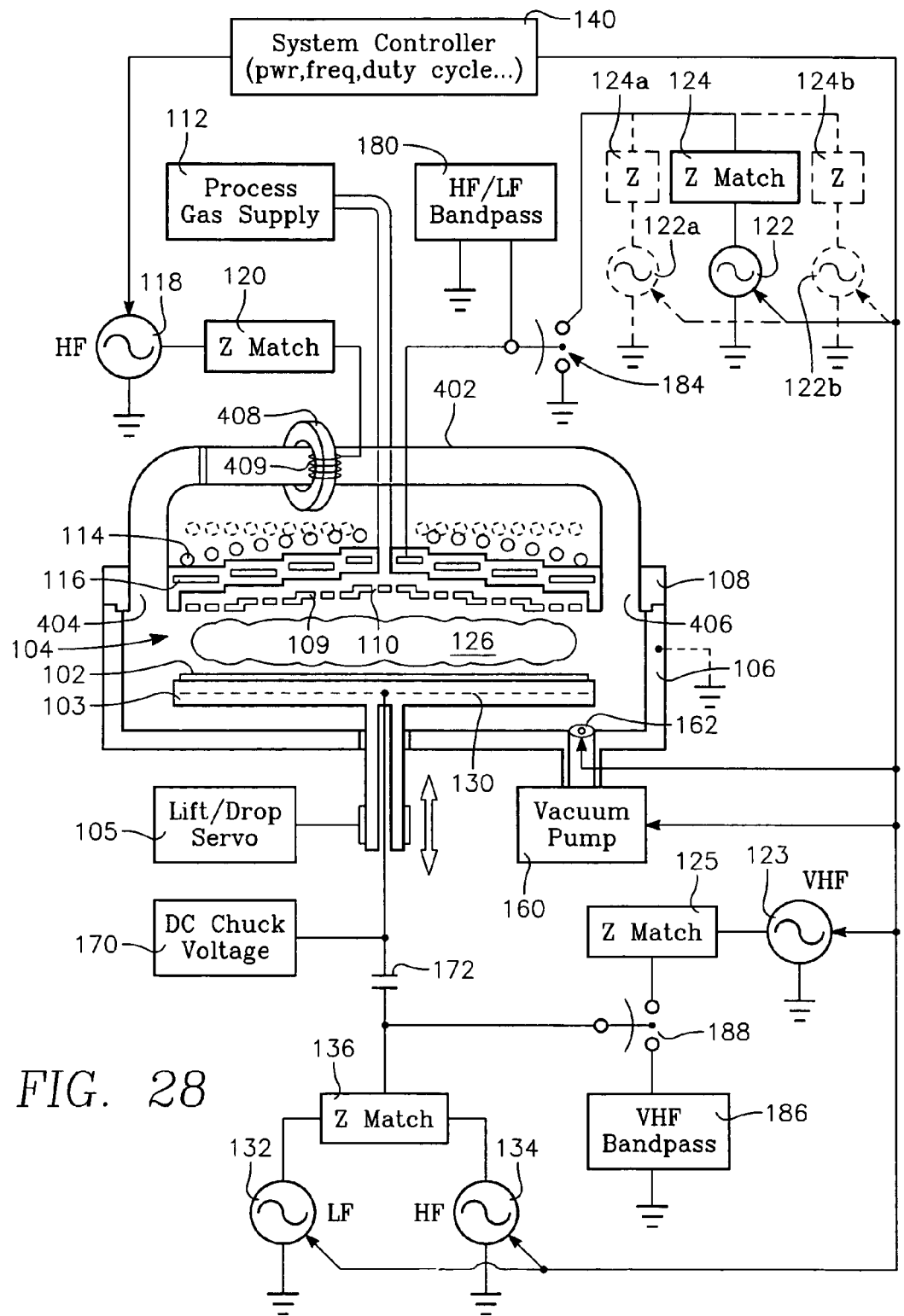
FIG. 28 illustrates a plasma reactor in accordance with another embodiment.

FIG. 27 illustrates another embodiment in which the inductively coupled source power applicator 114 is a toroidal source rather than an inductive antenna. The toroidal source consists of an external hollow reentrant conduit 402 coupled to a pair of openings 404, 406 in the chamber enclosure that are separated by the diameter of the process region. For example, in the implementation of FIG. 27, the openings 404, 406 are through the ceiling 108 and are at the edge of the chamber so that they are separated by the diameter of the wafer support 103. RF power is coupled into the interior of the conduit 402 by means of a magnetic (e.g., iron) toroidal core 408 having a conductive winding 409 wrapped around a portion of the core 408. The RF generator 118 is coupled through the match 120 to the winding 409. This toroidal source forms a plasma current in a circular path that passes through the conduit 402 and through the processing region overlying the wafer 102. This plasma current oscillates at the frequency of the RF generator 118. FIG. 28 depicts a modification of the reactor of FIG. 27 in which the ceiling 108 and showerhead 109 are a center high step shape (solid line) or dome shaped (dotted line). One advantage of the toroidal plasma source of FIGS. 27 and 28 is that RF power is not inductive coupled directly through the gas distribution showerhead 109 nor through the ceiling electrode 116b. Therefore, the showerhead 109 may be metal and the ceiling electrode 116a may be solid (without the slots 115 of FIG. 20), or the ceiling electrode may be eliminated and the VHF power coupled directly to the metal gas distribution showerhead 109 so that the metal showerhead 109 functions as the ceiling electrode.

Each of the reactors of FIGS. 19-26 capacitively couples VHF source power into the chamber while inductively coupling HF source power into the chamber. The reactors of FIGS. 27-28 capacitively couple VHF source power into the chamber and inductively couple HF source power to an oscillating toroidal plasma current that passes through the process region of the chamber. This inductive coupling element faces an external portion of the oscillating toroidal plasma current. The capacitively coupled power is applied in the embodiments of FIGS. 19-26 to the ceiling electrode 116a or to the wafer support electrode 116b, and is applied in the embodiments of FIGS. 27-28 to a conductive version of the showerhead 109 (or to the wafer support electrode 116b). The capacitively coupled power generates ions in the bulk plasma because it is in the VHF frequency range (27-200 MHz). In this frequency range, kinetic electrons in the bulk plasma follow the capacitively coupled RF field oscillations and therefore acquire sufficient energy to contribute to ion generation. Below this range, the capacitively coupled power would contribute more to ion energy in the plasma sheath rather than to ion generation in the bulk plasma, and therefore would not be plasma source power. Therefore, in order to provide plasma source power (i.e., power for generating ions in the bulk plasma), the RF generator 122 (or 123) coupled to the electrode 116a (or 130) provides VHF power.

While control over all process parameters has been described as being carried out by two controllers 140, 142, it is understood that the controllers may be realized in a single controller that controls all process parameters and adjustments.

The foregoing methods are applicable to plasma processing of a semiconductor wafer or plasma processing of a plasma display substrate.

What is claimed is:

1. A plasma reactor for processing a workpiece, comprising:
   an enclosure forming a reactor chamber and a workpiece support within said chamber, said enclosure including a ceiling facing said workpiece support;
   a toroidal plasma source comprising a hollow reentrant conduit external of said chamber and having a pair of ends connected to the interior of said chamber and forming a closed toroidal path extending through said conduit and across a diameter of said workpiece support, and an RF power applicator adjacent a portion of said reentrant external conduit;

an RF power generator coupled to the RF power applicator of said toroidal plasma source;

a capacitively coupled plasma source power applicator comprising a source power electrode at one of: (a) said ceiling (b) said workpiece support, and a VHF power generator coupled to said capacitively coupled source power applicator;

a plasma bias power applicator comprising a bias power electrode in said workpiece support;

at least a first RF bias power generator coupled to said plasma bias power applicator;

process gas distribution apparatus comprising a gas distribution showerhead in said ceiling;

a vacuum pump for evacuating said chamber; and a first controller for adjusting relative amounts of power simultaneously coupled to plasma in said chamber and conduit by said toroidal plasma source and said capacitively coupled plasma source power applicator.

2. The reactor of claim 1 further comprising:

a second RF bias power generator coupled to said bias power electrode, said first and second RF bias power generators providing RF power at a low frequency and at a high frequency, respectively;

a second controller for adjusting the relative amounts of power simultaneously coupled to said bias power electrode by said first and second RF bias power generators.

3. The reactor of claim 2 wherein said low frequency and said high frequency are greater and less than, respectively, a sheath ion transmit frequency of plasma in said chamber.

4. The reactor of claim 2 wherein said first and second generators are comprised within a single generator and said second controller is for governing a phase difference between VHF current or voltage delivered by said single generator to the respective electrodes.

5. The reactor of claim 1 wherein said source power electrode is at said workpiece support and wherein said source power electrode and said bias power electrode are the same electrode.

6. The reactor of claim 1 wherein said capacitively coupled plasma source power applicator comprises both the electrode at the ceiling and said bias power electrode within the workpiece support, said VHF source power generator being connected to one of said electrodes and the other of said electrodes being coupled to a VHF return potential.

7. The reactor of claim 6 wherein said VHF source power generator is coupled to said electrode at said ceiling, said reactor further comprising a VHF bandpass filter connected between said bias power electrode and ground whereby said bias power electrode is a counterelectrode for said electrode at said ceiling.

8. The reactor of claim 7 further comprising an LF/HF bandpass filter connected between said ceiling electrode and ground, whereby said ceiling electrode is a counterelectrode for bias power applied to said bias power electrode.

9. The reactor of claim 6 wherein said VHF source power generator is coupled to said bias power electrode at said workpiece support, said electrode at said ceiling being connected to ground whereby said electrode at said ceiling is a counterelectrode for VHF power applied to said bias power electrode and for HF or LF bias power applied to said bias power electrode.

10. The reactor of claim 1 wherein said capacitively coupled plasma source power applicator comprises both the electrode at the ceiling and said bias power electrode within the workpiece support, said VHF source power generator being coupled to one of said electrodes, said reactor further comprising a second VHF power generator coupled to the other of said electrodes for simultaneous application of VHF power to both electrodes, wherein said controller is for controlling a phase difference between VHF power applied to the two electrodes.

11. The reactor of claim 1 wherein said first controller is for controlling an evacuation rate of said chamber by said vacuum pump.

12. The reactor of claim 1 wherein said workpiece support is translatable toward and away from said ceiling, said reactor further comprising a lift servo coupled to said workpiece support, said first controller for controlling said lift servo.

13. The reactor of claim 1 wherein said gas distribution showerhead is formed of a conductive material and comprises said source power electrode.

14. The reactor of claim 1 wherein said ceiling and said gas distribution showerhead have a dome shape.

15. The reactor of claim 14 wherein said dome shape is one of: (a) smooth, (b) stepped.

16. The reactor of claim 14 wherein said dome shape is center high relative a ceiling-to-workpiece distance.

* * * * *